United States Patent
Miyamoto

(10) Patent No.: US 9,193,180 B2
(45) Date of Patent: Nov. 24, 2015

(54) PATTERN FORMATION METHOD

(71) Applicant: FUJIFILM Corporation, Tokyo (JP)

(72) Inventor: Kimiaki Miyamoto, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/460,261

(22) Filed: Aug. 14, 2014

(65) Prior Publication Data

US 2014/0354745 A1    Dec. 4, 2014

Related U.S. Application Data

(63) Continuation of application No. PCT/JP2013/054140, filed on Feb. 20, 2013.

(30) Foreign Application Priority Data

Mar. 5, 2012    (JP) .................................. 2012-048499

(51) Int. Cl.
| | | |
|---|---|---|
| *B41J 11/00* | (2006.01) | |
| *H01L 27/12* | (2006.01) | |
| *H01L 29/786* | (2006.01) | |
| *H01L 29/66* | (2006.01) | |

(52) U.S. Cl.
CPC ......... *B41J 11/0015* (2013.01); *H01L 27/1292* (2013.01); *H01L 29/66742* (2013.01); *H01L 29/78636* (2013.01)

(58) Field of Classification Search
CPC ................ B41J 11/0015; B41J 11/002; H01L 29/78636; H01L 27/1292; B05D 1/26
See application file for complete search history.

(56) References Cited

U.S. PATENT DOCUMENTS

| | | |
|---|---|---|
| 6,316,574 B1 | 11/2001 | Tanioka et al. |
| 6,620,339 B1 | 9/2003 | Shimizu et al. |
| 6,946,169 B1 | 9/2005 | Tanioka et al. |
| 2004/0238816 A1 | 12/2004 | Tano et al. |
| 2005/0214688 A1* | 9/2005 | Yamamoto et al. ........... 430/311 |
| 2006/0124925 A1* | 6/2006 | Kondo et al. .................... 257/40 |
| 2009/0078937 A1* | 3/2009 | Saito et al. ...................... 257/59 |
| 2010/0069569 A1 | 3/2010 | Maeda et al. |

(Continued)

FOREIGN PATENT DOCUMENTS

| | | |
|---|---|---|
| EP | 1643301 A1 | 4/2006 |
| JP | H11-193345 A | 7/1999 |
| JP | H11-193346 A | 7/1999 |

(Continued)

OTHER PUBLICATIONS

Notification of Transmittal of Translation of the International Preliminary Report on Patentability and Translation of Written Opinion of the International Searching Authority; PCT/JP2013/054140; issued on Sep. 18, 2014.

(Continued)

*Primary Examiner* — Manish S Shah
*Assistant Examiner* — Jeremy Delozier
(74) *Attorney, Agent, or Firm* — Studebaker & Brackett PC

(57) ABSTRACT

A pattern formation method includes a first step of forming a film having a flat surface on an uneven structure including a concave portion exhibiting liquid repellency and a convex portion exhibiting lyophilic properties so as to cover the concave portion and the convex portion; and a second step of forming a pattern by drying the film.

10 Claims, 11 Drawing Sheets

(56) References Cited

U.S. PATENT DOCUMENTS

| 2010/0078642 A1 | 4/2010 | Tano et al. |
| 2010/0181571 A1 | 7/2010 | Tano et al. |

FOREIGN PATENT DOCUMENTS

| JP | H11-193347 A | 7/1999 |
| JP | 2002-162630 A | 6/2002 |
| JP | 2003-096034 A | 4/2003 |
| JP | 2003-222972 A | 8/2003 |
| JP | 2003-267982 A | 9/2003 |
| JP | 2004-140078 A | 5/2004 |
| JP | 2005-310962 A | 11/2005 |
| JP | 2009-026899 A | 2/2009 |
| JP | 2009-026900 A | 2/2009 |
| JP | 2009-026901 A | 2/2009 |
| WO | 2008/133300 A1 | 11/2008 |

OTHER PUBLICATIONS

International Search Report; PCT/JP2013/054140; May 28, 2013.
The extended European search report issued by the European Patent Office on Oct. 2, 2015, which corresponds to European Patent Application No. 13757812.6-1504 and is related to U.S. Appl. No. 14/460,261.
An Office Action issued by the Korean Patent Office on Aug. 10, 2015, which corresponds to Korean Patent Application No. 10-2014-7024594 and is related to U.S. Appl. No. 14/460,261; with English language translation.
An Office Action; "Notice of Reasons for Rejection," issued by the Japanese Patent Office on Oct. 6, 2015, which corresponds to Japanese Patent Application No. 2012-048499 and is related to U.S. Appl. No. No.14/460,261; with English language partial translation.
An Office Action issued by the Korean Patent Office on Aug. 10, 2015, which corresponds to Korean Patent Application No. 10-2014-7024594 and is related to U.S. Appl. No. 14/460,261; with English language partial translation.

* cited by examiner

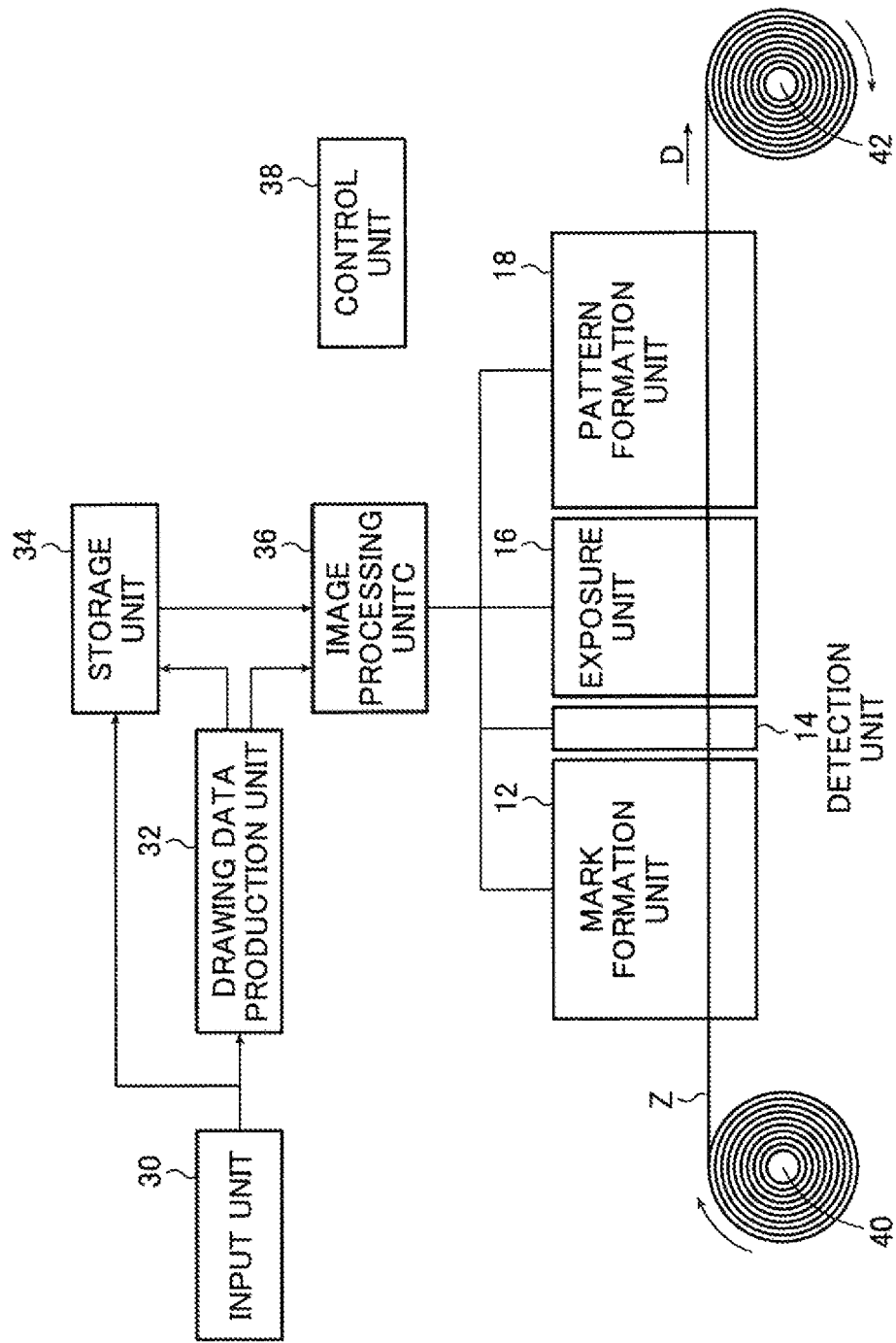

FIG. 12
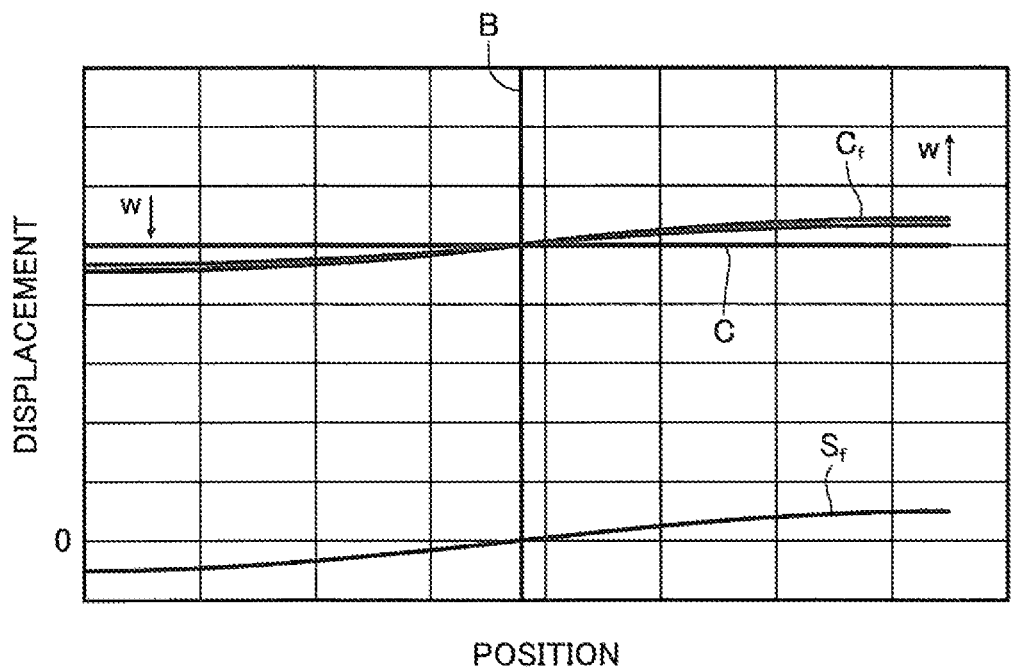
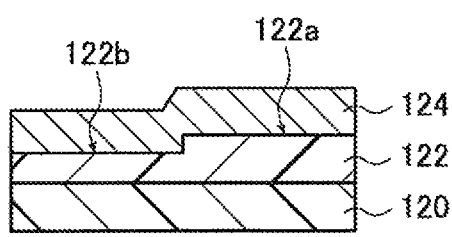
FIG. 13A
PRIOR ART
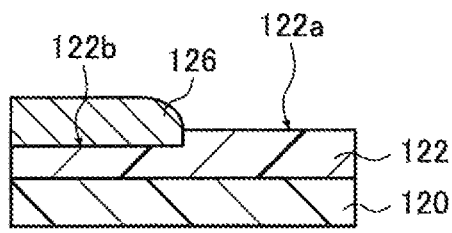
FIG. 13B
PRIOR ART

PATTERN FORMATION METHOD

CROSS-REFERENCE TO RELATED APPLICATIONS

This application is a Continuation of PCT International Application No. PCT/JP2013/054140 filed on Feb. 20, 2013, which claims priority under 35 U.S.C. §119(a) to Japanese Application No. 2012-048499 filed on Mar. 5, 2012. Each of the above application(s) is hereby expressly incorporated by reference, in its entirety, into the present application.

BACKGROUND OF THE INVENTION

The present invention relates to a pattern formation method for forming a pattern by controlling liquid repellency and lyophilic properties, particularly to a pattern formation method for forming a pattern having a flat surface by preventing dewetting of a liquid film from occurring.

In recent years, techniques to form wiring of electronic circuits and micropatterns such as electric wiring patterns on substrates have been drawing attention. A liquid discharge head of an inkjet system (inkjet head) is used for the formation of such a micropattern, for example. In this case, droplets of liquid having metal particles or resin particles dispersed therein are jetted from the inkjet head to draw a pattern, and the liquid is cured by heating, thereby forming an electric wiring pattern.

Currently, in some cases, a liquid-repellent film is formed on a flexible substrate (support) such as PET or PEN, and wiring of an electronic circuit and a micropattern such as an electric wiring pattern as described above is formed on the liquid-repellent film. Such a micropattern is used to form a gate electrode, a source electrode and a drain electrode of a thin film transistor (hereinafter called "TFT").

JP2009-26901 A discloses a laminated structure composed of a substrate, a wettability changeable layer, a conductive layer and a semiconductor layer. The wettability changeable layer is a layer in which the critical surface tension (also called "surface free energy") varies due to imparted energy such as heat, ultraviolet light, an electron beam and plasma, and has formed thereon a high surface energy portion where the critical surface tension (surface free energy) is relatively high and a low surface energy portion where the critical surface tension (surface free energy) is relatively low. The conductive layer is formed at the high surface energy portion while the semiconductor layer is provided so as to be in contact with at least the low surface energy portion.

As a result of ultraviolet irradiation, the wettability changeable layer changes into the high surface energy portion due to the imparted energy and at the same time, the thickness of the wettability changeable layer is slightly reduced. This thickness reduction causes a level difference at the boundary line between the high surface energy portion and the low surface energy portion, and the level difference serves as a bank.

In JP2009-26901 A, lyophilic ink is discharged to the high surface energy portion that is a lyophilic surface by an inkjet method. At this time, the lyophilic ink hits the surface and wet-spreads thereon. However, in JP2009-26901 A, a three-dimensional level difference is formed at the boundary between the high surface energy portion and the low surface energy portion and therefore, the ink can be prevented from running off to the low surface energy portion area. As a result, a pattern (conductive layer) can have an excellent edge shape, and electron elements having the uniform characteristics can be fabricated.

As disclosed in JP2009-26901 A, in the case where a pattern (conductive layer) is formed using the hydrophilic/hydrophobic variable layer (wettability changeable layer) in which, upon receipt of energy such as ultraviolet light, the portion applied with the energy is caused to be lyophilic (high surface energy portion) and the film thickness of the portion is reduced, a pattern (conductive layer) can be formed as described below.

First, a lyophilic/lyophobic variable layer 122 that is originally liquid-repellent is formed on a support 120 as shown in FIG. 13A. Then, the lyophilic/lyophobic variable layer 122 is irradiated with, for instance, ultraviolet light to form a liquid-repellent portion 122a and a lyophilic portion 122b. Due to the ultraviolet irradiation, a level difference arises between the liquid-repellent portion 122a and the lyophilic portion 122b. When a liquid film 124, which is to be a pattern (conductive layer), is formed to have a uniform thickness under this condition, a level difference arises also at the surface of the liquid film 124 in accordance with the level difference of the underlayer. Hence, the liquid film 124 having an uneven surface is formed. The liquid film 124 having the uneven surface is formed because the surface reflects the level difference of the underlayer between the liquid-repellent portion 122a and the lyophilic portion 122b.

Thereafter, the liquid film 124 is repelled by the liquid-repellent portion 122a so that a pattern (conductive layer) 126 as shown in FIG. 13B is formed.

Alternatively, as shown in FIG. 14A, a lyophilic/lyophobic variable layer 122 that is originally liquid-repellent is formed on a support 120. Then, the lyophilic/lyophobic variable layer 122 is irradiated with, for instance, ultraviolet light to form a liquid-repellent portion 122a and a lyophilic portion 122b. In this example, there is no level difference between the liquid-repellent portion 122a and the lyophilic portion 122b and the surface is flat. When a liquid film 124, which is to be a pattern (conductive layer), is formed to have a uniform thickness under this condition, the liquid film 124 having a flat surface is formed.

Thereafter, the liquid film 124 is repelled by the liquid-repellent portion 122a so that a pattern (conductive layer) 126 as shown in FIG. 14B is formed.

SUMMARY OF THE INVENTION

Conventionally, patterns (conductive layers) are formed as described above. However, the conventional technique takes no account of the possibility that an insulating film or the like is further formed on the structure of FIG. 13B or FIG. 14B and of a method of forming the insulating film. Therefore, when an insulating film is formed on the structure of FIG. 13B or FIG. 14B, the insulating film is formed in accordance with the surface profile of the structure and hence, the insulating film surface is not flat. This leads to a problem in that when wiring, electrodes or the like is formed on such an uneven insulating film, specified accuracy in shape and position cannot be attained. In addition, there is another problem in that extra steps arise in order to flatten the surface of an insulating film.

If the pattern formation methods as described above are applied to, for instance, the manufacture of TFTs, high productivity cannot be achieved, and TFTs are not produced with specified accuracy.

An object of the present invention is to solve the above problems associated with the conventional art and provide a pattern formation method capable of maintaining specified accuracy and achieving high productivity.

In order to achieve the foregoing object, the present invention provides a pattern formation method, comprising: a first step of forming a film having a flat surface on an uneven structure including a concave portion exhibiting liquid repellency and a convex portion exhibiting lyophilic properties so as to cover the concave portion and the convex portion; and a second step of forming a pattern by drying the film.

For example, the film is one of a film having lyophilic properties, a film having liquid repellency and a lyophilic/lyophobic variable film having a lyophilic/lyophobic variable function.

Preferably, on the lyophilic/lyophobic variable film, a portion irradiated with ultraviolet light is caused to be lyophilic and to reduce in thickness.

Preferably, the convex portion is constituted by electric wiring or an electrode for a semiconductor, and the concave portion is constituted by a support on which the electric wiring or the electrode for the semiconductor is formed or by an insulating layer on which the electric wiring or the electrode for the semiconductor is formed. For example, the pattern is the insulating layer.

Preferably, the film is formed with a coating liquid that satisfies: $\sigma > 0.153\, p^{1.947} \times \delta^{-3.84} \times |a_H|^{1.022}$, where surface tension is denoted by $\sigma$ (N/m); film thickness is denoted by $\delta$ (m); pitch of irregularities made up of the concave portion exhibiting liquid repellency and the convex portion exhibiting lyophilic properties is denoted by $p$ (m); and Hamaker constant is denoted by $a_H$ (J). Given that the concave portion exhibiting liquid repellency and the convex portion exhibiting lyophilic properties constitute a line and space pattern, the term "pitch of irregularities" herein refers to a total width of one line and one space.

For example, the first step forms the film having the flat surface by an inkjet method by adjusting an amount of ink jetted to the concave portion exhibiting liquid repellency to be larger than an amount of ink jetted to the convex portion exhibiting lyophilic properties.

According to the present invention, in order to form a pattern, a film having a flat surface is formed on an uneven structure including a concave portion exhibiting liquid repellency and a convex portion exhibiting lyophilic properties so as to cover the concave portion and the convex portion, and consequently dewetting of the film is suppressed and the surface of the film is held flat, thereby forming a substantially flat pattern. Furthermore, in the case where wiring, an electrode or the like is formed on the pattern, since the wiring or the like is formed on the flat surface, specified accuracy is easily maintained in terms of shape and position. In addition, it is not necessary to flatten the film, hence no extra step arise, and high productivity can be achieved. Therefore, when the present invention is applied to the manufacture of TFTs, the accuracy improves in terms of, for instance, the distance between a source electrode and a drain electrode, whereby thin film transistors can be formed with high accuracy. Thus, it is possible to manufacture high-quality TFTs with high productivity.

BRIEF DESCRIPTION OF THE DRAWINGS

FIG. 1 is a schematic view showing an example of a pattern formation apparatus for use in a pattern formation method according to an embodiment of the invention.

FIG. 11A shows results of the first analysis model; and FIG. 11B shows results of the second analysis model.

FIG. 12 is a graph showing a film thickness distribution obtained by an analysis, i.e., results of the third analysis model.

FIGS. 13A and 13B are schematic cross-sectional views showing, in the order of process steps, a pattern formation method described in JP2009-26901 A.

DETAILED DESCRIPTION OF THE INVENTION

A pattern formation method of the invention is described below in detail in accordance with preferred embodiments shown in the accompanying drawings.

Figure 2A:
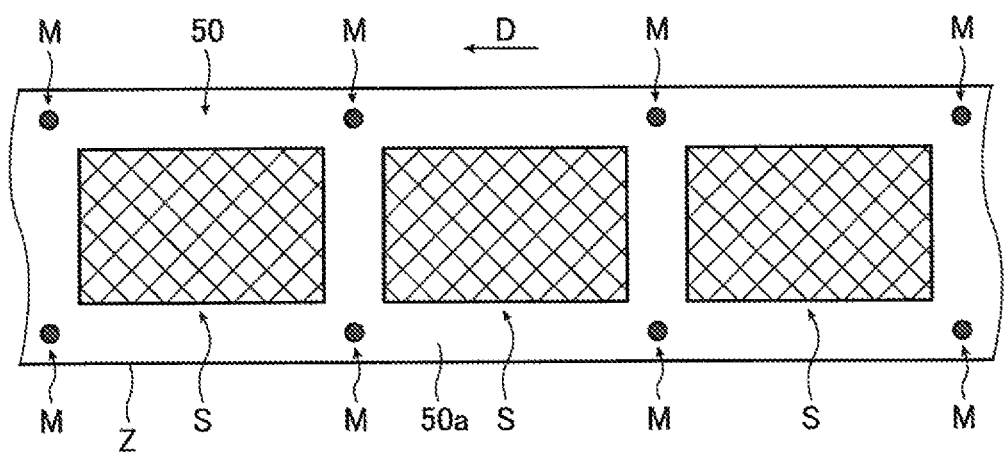
FIG. 2A is a schematic plan view showing a substrate on which a first film is formed as used in the pattern formation method according to the embodiment of the invention.
Figure 2B:
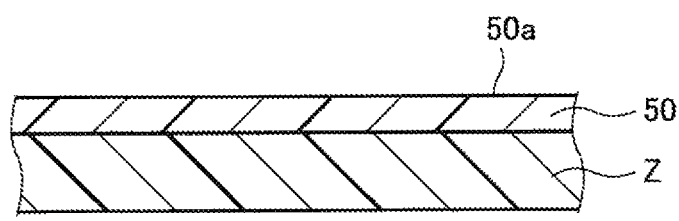
FIG. 2B is a schematic cross-sectional view showing the substrate on which the first film is formed as used in the pattern formation method.

FIG. 1 is a schematic view showing an example of a pattern formation apparatus for use in the pattern formation method according to an embodiment of the invention. FIG. 2A is a schematic plan view showing a substrate on which a first film is formed as used in the pattern formation method according to the embodiment of the invention; and FIG. 2B is a schematic cross-sectional view showing the substrate on which the first film is formed as used in the pattern formation method.

A pattern formation apparatus 10 (hereinafter simply called "formation apparatus 10") shown in FIG. 1 is, for example, for use in the roll-to-roll process in which various treatments are carried out while a substrate Z is transported in a longitudinal direction. The formation apparatus 10 is configured to form micropatterns, e.g., patterns having a line width of less than 50 μm.

The formation apparatus 10 includes a mark formation unit 12, a detection unit 14, an exposure unit 16 and a pattern formation unit 18. The formation apparatus 10 further includes an input unit 30, a drawing data production unit 32, a storage unit 34, an image processing unit 36 and a control unit 38. The control unit 38 controls the operation of these constituent units of the formation apparatus 10.

In the formation apparatus 10, the substrate Z is wound around a rotary shaft 40 and mounted in a roll shape. The rotary shaft 40 is configured to continuously feed the substrate Z and, for instance, connected with a motor (not shown). The motor works so that the substrate Z is continuously fed in a transport direction D.

A wind-up shaft 42 is provided to wind up the substrate Z that has passed through the mark formation unit 12, the detection unit 14, the exposure unit 16 and the pattern formation unit 18. The wind-up shaft 42 is, for instance, connected with a motor (not shown). The motor serves to cause the wind-up shaft 42 to rotate so that the substrate Z is wound up around the wind-up shaft 42 in a roll shape. Thus the substrate Z is transported in the transport direction D.

In this embodiment, a first film 50 is formed on the substrate Z as shown in FIG. 2B. The first film 50 is composed of a liquid-repellent agent. The liquid-repellent agent has a function to allow its degree of lyophilic properties to vary upon receipt of light at a predetermined wavelength, for example, ultraviolet light (UV light). Furthermore, the first film 50 is reduced in thickness due to irradiation with ultraviolet light (UV light).

The function of the first film 50 to allow its degree of lyophilic properties to vary is, for example, a lyophilic/lyophobic variable function. The first film 50 is a lyophilic/lyophobic variable film having the function to allow its degree of lyophilic properties to vary, i.e., the lyophilic/lyophobic variable function.

As shown in FIG. 2A, alignment marks M (mark pattern) are formed on a surface 50a of the first film 50 so as to be positioned at four corners of the outer frame of each rectangular formation region S.

The substrate Z is specifically described below.

The formation apparatus 10 of the embodiment is for use in the roll-to-roll process and hence, a resin film is used as the substrate Z from the viewpoint of productivity, flexibility and the like. The resin film is not particularly limited, and may be appropriately selected from known resin films in terms of the material, the shape, the structure, the thickness and the like.

Examples of the resin film include polyester resin films such as polyethylene terephthalate (PET), polyethylene naphthalate (PEN) and modified polyester; polyolefin resin films such as polyethylene (PE) resin films, polypropylene (PP) resin films, polystyrene resin films and cyclic olefin resin; and vinyl resin films such as polyvinyl chloride and polyvinylidene chloride, as well as polyetheretherketone (PEEK) resin films, polysulfone (PSF) resin films, polyethersulfone (PES) resin films, polycarbonate (PC) resin films, polyamide resin films, polyimide resin films, acrylic resin films and triacetyl cellulose (TAC) resin films.

When a thin film transistor (TFT) fabricated with the formation apparatus 10 is used for application to a display or the like, a transparent resin film is preferably used for the substrate Z, and a resin film to be used is not limited as long as it has a light transmittance in a visible wavelength range of at least 80%. In particular, biaxially stretched polyethylene terephthalate films, biaxially stretched polyethylene naphthalate films, polyethersulfone films and polycarbonate films are preferred, and biaxially stretched polyethylene terephthalate films and biaxially stretched polyethylene naphthalate films are more preferred in terms of transparency, heat resistance, ease of handling, strength and costs.

The formation apparatus 10 may be of sheet type as described later. In this case, various materials may be used for the substrate Z and exemplary materials thereof include silicon wafers, quartz glass, glass, plastics and metal plates. The material is not particularly limited as long as it allows a semiconductor film, a metal film, a dielectric film, an organic film and the like to be formed on the substrate surface in a laminated manner.

As the substrate, use may be made of a substrate having formed on its surface various films such as a semiconductor film, a metal film, a dielectric film and an organic film, a film composed of a functional material, and a functional element.

Next, a specific example of the liquid-repellent agent that constitutes the first film 50 is described. The first film 50 serves as a lyophilic/lyophobic-variable functional material and is composed of the liquid-repellent agent as described above. The first film 50 has a thickness (film thickness) of preferably 0.001 µm to 1 µm and most preferably 0.01 µm to 0.1 µm.

The first film 50 is different in a degree of lyophilic properties between a portion not having irradiated with energy (pattern-unformable area) and a portion having irradiated with energy (pattern-formable area), and the portion having irradiated with energy (pattern-formable area) has a higher degree of lyophilic properties. Further, in the first film 50, the thickness of the portion having irradiated with energy (pattern-formable area) is reduced by, for instance, 10 nm and a level difference arises between the portion not having irradiated with energy (pattern-unformable area) and the portion having irradiated with energy (pattern-formable area). When the film thickness is reduced by 3 nm, i.e., when there is a level difference of 3 nm, the effects of pattern formation to be described later can be achieved. The required reduction in film thickness is therefore about 3 to 10 nm and the level difference is about 3 to 10 nm. When the first film 50 is composed of monomers, the film contracts by about 10% during polymerization upon ultraviolet irradiation so that the film thickness is reduced. When the first film 50 is composed of polymers, the film contracts by about 10% during partial decomposition upon ultraviolet irradiation so that the film thickness is reduced.

It should be noted that the first film 50 does not necessarily have to be a film on which a level difference arises as described above and only has to be configured so that a portion having irradiated with energy (pattern-formable area) is caused to be lyophilic.

In this embodiment, the film thickness, the level difference at the film, the amount of reduction in film thickness, and the like may be measured using various known measurement methods. Exemplary measurement methods include a method in which cross-sectional photographs or cross-sectional images are acquired and the measurement is performed using the cross-sectional photographs or the cross-sectional images; a method in which the distance to an interface is measured with a spectroscopic analysis microscope; a method in which a part of the film is peeled and the level difference is mechanically measured; and a method in which a part of the film is peeled and the level difference is measured with AFM (atomic force microscope).

Examples of an inorganic material in the liquid-repellent agent include oxides such as titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$) and iron oxide ($Fe_2O_3$). Of these, one or more than one oxide may be selected for use. For example, in the case where titanium dioxide is used, either of anatase-type titanium dioxide or rutile-type titanium dioxide is applicable but anatase-type titanium dioxide is preferred.

In the liquid-repellent agent, a binder to be used preferably has a high bond energy to such an extent that the main skeleton is prevented from being decomposed upon photoexcitation of oxide, and in the case where a binder is configured to have the function of causing the wettability to vary by action of oxide, the binder preferably has a high bond energy to such an extent that the main skeleton is prevented from being decomposed upon photoexcitation of oxide and also includes an organic substituent that is decomposed by action of oxide. Examples of such a binder include an organopolysiloxane exhibiting high strength that is obtained by subjecting chlorosilane, alkoxysilane or the like to hydrolysis and polycondensation using sol-gel reaction or the like, and organopolysiloxane that is obtained by crosslinking reactive silicone excellent in water and oil repellency.

Alternatively, a stable organosilicon compound in which crosslinking reaction does not occur, such as dimethylpolysiloxane, may be mixed into a binder along with the above-described organopolysiloxane.

Still alternatively, an oxide-containing layer may contain a decomposition material that is decomposed by action of oxide upon energy irradiation, whereby the wettability on the oxide-containing layer is caused to vary. As such a decomposition material, use may be made of a surfactant that is decomposed by action of oxide and has the function of causing the wettability at the surface of a photocatalyst-containing layer to vary by means of the decomposition.

Specific examples of the surfactant include nonionic fluorosurfactants and nonionic silicone surfactants, while cationic surfactants, anionic surfactants and amphoteric surfactants may also be used. Examples of the decomposition material further include, in addition to surfactants, oligomers and polymers such as polyvinyl alcohol, unsaturated polyester, acrylic resin, polyethylene, diallyl phthalate, ethylene-propylene-diene monomers, epoxy resin, phenolic resin, polyurethane, melamine resin, polycarbonate, polyvinyl chloride, polyamide, polyimide, styrene-butadiene rubber, chloroprene rubber, polypropylene, polybutylene, polystyrene, polyvinyl acetate, nylon, polyester, polybutadiene, polybenzimidazole, polyacrylonitrile, epichlorohydrin, polysulfide and polyisoprene.

In addition, exemplary compounds that are to be lyophilic include onium salts such as diazonium salts, sulfonium salts and iodonium salts, o-nitrobenzyl sulfonate compounds, p-nitrobenzyl sulfonate compounds used in combination with a sensitizer, 1,2,3-trisbenzene, N-imide sulfonate compounds, oxime sulfonate compounds, α-keto sulfonate compounds, naphthoquinone diazide-4-sulfonate compounds, diazodisulfone compounds, disulfone compounds, keto sulfone compounds, o-nitrobenzyl ester compounds, m-alkoxy benzyl ester compounds, o-nitrobenzyl amide compounds, benziso ester compounds, phenacyl ester compounds, 2,4-dinitrobenzene sulfonyl ester, 2-diazo-1,3-diketone compounds, phenol ester compounds, o-nitrobenzyl phenol compounds, 2,5-cyclohexadienone compounds, sulfonated polyolefin and aryl diazosulfonate salts.

The mark formation unit 12 is configured to form alignment marks M (mark pattern) on the first film 50 having the above-described lyophilic/lyophobic variable function, for instance, on the surface 50a of the first film 50 on the substrate Z so as to be positioned at four corners of the outer frame of each rectangular formation region S as shown in FIG. 2A.

The mark formation unit 12 has a mark exposure unit (not shown) and a mark printing unit (not shown), and the mark exposure unit is provided on the upstream side of the transport direction D.

The mark exposure unit includes a light source (not shown) that irradiates the first film 50 with light at a wavelength capable of changing liquid-repellent properties of the first film 50 into lyophilic properties and reducing the film thickness; a mask (not shown); and a mark printing section (not shown). The light source for use is capable of irradiation of light at a wavelength in an ultraviolet range, such as wavelengths of 300 (nm), 365 (nm) and 405 (nm).

The mask is for use in, for instance, forming alignment marks M of circular shape as shown in FIG. 2A. However, the shape of alignment marks M is not limited to the circular shape.

The mark printing unit is for printing alignment marks M by applying visualization ink onto exposed areas that have been exposed to light of a mark pattern for forming the alignment marks M, thereby forming the alignment marks M.

A printing method using the mark printing unit is not particularly limited as long as it can supply visualization ink onto an area having been exposed to light of a mark pattern. Usable printing methods include solid printing. In addition, for instance, inkjet printing, screen printing, relief printing and intaglio printing may be used.

The visualization ink for use in forming alignment marks M is of the type absorbing or reflecting light at a wavelength at which the change in lyophilic/lyophobic properties of the first film 50 is not caused, whereby unnecessary change in lyophilic/lyophobic properties of the first film 50 is prevented from occurring during detection of alignment marks M. A type of the visualization ink is appropriately selected depending on the wavelength at which the change in lyophilic/lyophobic properties of the first film 50 is caused. For example, use is made of ink that absorbs or reflects light at a wavelength of 500 nm or more. As the visualization ink, water-soluble ink or metallic ink is used, for example, The detection unit 14 is configured to detect alignment marks M to acquire positional information of the alignment marks M. The detection unit 14 is connected to the image processing unit 36. The detection unit 14 has a strain sensor (not shown) and an alignment detection unit (not shown).

The strain sensor is for detecting alignment marks M with the use of light at a wavelength at which the change in lyophilic/lyophobic properties of the first film 50 is not caused. An exemplary strain sensor is of optical type having a light source such as an LED; and an image sensor such as a CMOS and a CCD. In the case where the visualization ink used is of the type absorbing or reflecting light at a wavelength of 500 nm or more, the light source is one that emits light at a wavelength of 500 nm or more. More specifically, the wavelength of the light source is 633 nm, 660 nm or 590 nm, or the wavelength of infrared (IR) light, for instance.

In the strain sensor, alignment marks M are irradiated with light at a wavelength of at least 500 nm, images of the alignment marks M previously formed at four corners of the outer frame of each formation region S shown in FIG. 2A are taken, and, for instance, image data of four alignment marks M is acquired. Pieces of image data of four alignment marks M are defined as one set and output to the alignment detection unit.

The alignment detection unit is for producing strain information of the substrate Z (positional information of alignment marks M) by, on the basis of image data of each alignment mark M acquired in the strain sensor, calculating the position, size and orientation of each alignment mark M, the distance between adjacent alignment marks M and the like and by comparing the calculation results with designed values of size, arrangement positions and the like of each alignment mark M. The strain information of the substrate Z includes, for instance, the direction of expansion and contraction of the substrate Z and the amount of expansion and contraction of the substrate Z. To be more specific, the strain information of the substrate Z includes the direction and amount of expansion and contraction of each formation region S surrounded by four alignment marks M, the direction and amount of rotation of each formation region S, the amount of increase or decrease of each formation region S in size from a specified size, and the amount of straining into a trapezoidal shape or other shapes. The strain information of the substrate Z is output to the image processing unit 36. The image processing unit 36 produces corrected data for exposure (corrected exposure data) and corrected data for jetting (corrected jetting pattern data) on the basis of the strain information of the substrate Z, which will be described later.

An method of imaging alignment marks M with the strain sensor is not particularly limited, and exemplary methods include a method in which images of alignment marks M on the substrate Z being fixed are taken while the strain sensor is two-dimensionally moved; and a method in which images of alignment marks M on the substrate Z are taken while the substrate Z is moved.

The exposure unit 16 is configured to form a micropattern, for instance, a pattern having a line width of less than 50 µm, and is capable of forming a pattern-formable area at which a pattern is to be formed so as to have a line width at or below the foregoing value.

Exemplary patterns to be formed by the pattern formation method include wiring of electronic circuits and constituent elements of electron devices such as TFTs, as well as precursors thereof.

The exposure unit 16 performs the processing to cause a pattern-formable area at which a pattern is to be formed by the pattern formation unit 18 to be lyophilic (hereinafter simply called "lyophilic processing") for the first film 50 formed on the substrate Z. Due to the lyophilic processing, the thickness of the first film 50 is reduced at the pattern-formable area by about 3 to 10 nm. The exposure unit 16 includes an exposing unit (not shown) and a gas supply unit (not shown). The exposure unit 16 is connected to the image processing unit 36.

It should be noted that, when something is described as being caused to be lyophilic, this means that the contact angle of a droplet with respect to the first film 50 is caused to be relatively small. In other words, this means that a difference arises in liquid repellency.

The exposing unit irradiates, for example, a pattern-formable area at which a pattern is to be formed on the surface 50a of the first film 50 on the substrate Z with light capable of causing the first film 50 to be lyophilic (i.e., the pattern-formable area is exposed to light). A light source in the exposing unit is one having the same wavelength as the light source in the mark exposure unit, and use is made of, for instance, a light source capable of irradiation of light at a wavelength in an ultraviolet range, such as wavelengths of 300 (nm), 365 (nm) and 405 (nm). A laser source may also be used.

In the exposing unit, the output of ultraviolet light is, for instance, 1 to several hundreds (mJ/cm$^2$). Meanwhile, ultraviolet light of high output may adversely affect the characteristics of a substrate depending on the composition of the substrate. The output of ultraviolet light is therefore preferably as low as possible to the extent that the ultraviolet light is capable of causing the substrate to be lyophilic.

As the exposing unit, an exposing unit of digital exposure type using laser light and that of mask exposure type are applicable.

In the case of using the exposing unit of digital exposure type, a pattern-formable area at which a pattern is to be formed is irradiated with laser light in accordance with pattern data of the pattern to be formed which is output from the image processing unit 36, thereby performing the lyophilic processing. At this time, the pattern-formable area is caused to be lyophilic and the film thickness at the area is reduced, so that a level difference arises between the pattern-formable area and the pattern-unformable area.

In the case of using the digital exposure type exposing unit, for instance, the exposing unit is operated to perform a scan in a direction orthogonal to the transport direction D of the substrate Z, whereby, for instance, the lyophilic processing is performed on, of a pattern-formable area, a partial area that can undergo exposure processing with a single scan in that direction. After the lyophilic processing is done one time in this scanning direction, the substrate Z is shifted in the transport direction D by a predetermined amount and the lyophilic processing is performed on the next partial area of the same pattern-formable area. The lyophilic processing is implemented on the whole pattern-formable area by repeating the above operation. The thus configured lyophilic processing of serial method can be used.

Alternatively, the exposing unit may be provided with a scan optical unit (not shown) which performs a scan with laser light so that a scan in the lyophilic processing is carried out not with the exposing unit but with laser light.

Furthermore, the exposing unit may be of array type capable of emitting multiple laser light beams in the width direction of the substrate Z orthogonal to the transport direction D.

The gas supply unit is for, during light irradiation, optionally supplying reactant gas that causes a pattern-formable area of the substrate Z to be lyophilic. The gas supply unit adjusts the concentration (filling amount) of reactant gas at the substrate Z, the supply timing, and the like. The reactant gas is, for instance, of the type containing oxygen or nitrogen.

When the lyophilic processing can be satisfactory performed on the first film 50 only with ultraviolet irradiation, the gas supply unit is dispensable.

The pattern formation unit 18 is configured to form a second film, which is to be a pattern after drying, at a pattern-formable area that has been caused to be lyophilic and reduced in thickness. As described above, the first film 50 has a level difference between a pattern-unformable area and a pattern-formable area. Consequently, when the second film is simply formed, a level difference arises also at the surface of the second film according to the surface profile of the first film 50. However, the pattern formation unit 18 forms the second film so that the surface thereof is flat.

The second film that is to be a pattern becomes, for example, wiring of an electronic circuit or constituent elements of an electron device such as a TFT, as well as a precursor thereof. The second film will be described later in detail.

A method of pattern formation by the pattern formation unit 18 is not particularly limited as long as the second film can be formed at a pattern-formable area to have a flat surface, and exemplary methods thereof include a slot coating method, a blade coating method and an inkjet coating method.

In the slot coating and blade coating methods, a die is used, and the clearance between the first film 50 and a die edge supplying a coating liquid that is to be the second film is adjusted to the second film thickness or thereabout in formation of the second film. Owing to this configuration, the second film can be formed so that the surface thereof is flat regardless of the presence of level difference of the first film 50.

For the inkjet method, a piezo type, a thermal type or the like can appropriately be used. An applicable inkjet head used in the inkjet method is of serial type or full-line type.

When the inkjet method using an inkjet head is employed, ink droplets are jetted to a pattern-formable area having been caused to be lyophilic to thereby form a pattern according to jetting pattern data indicative of the position of the pattern-formable area having been caused to be lyophilic. The size of ink droplets jetted from the inkjet head is about 16 to 30 μm.

In the case where the inkjet method is used, ink droplets are jetted according to jetting pattern data and therefore the position where ink droplets are jetted can be readily changed by modifying the jetting pattern data.

In the inkjet method, the amount of ink jetted to a pattern-formable area having a small thickness is adjusted to be larger than that for a pattern-unformable area, thereby forming the second film having a flat surface. The inkjet method is advantageous when a pattern is formed for fabrication of, for example, an electrode having a wide area of a 100 μm square.

The pattern formation unit 18 may be used to form a third film 56 (see FIG. 3F) and an insulating film (not shown) that is to be a gate insulating layer 72 (see FIG. 5), which will be described later, to each have a flat surface in the same manner as in formation of the second film above. For instance, in the case where the inkjet method is used, the amount of ink jetted to a concave portion (pattern-unformable area) exhibiting liquid repellency is adjusted to be larger than that for a convex portion (pattern) exhibiting lyophilic properties, thereby forming a film having a flat surface.

Furthermore, aside from the second film, after a layer covering a pattern formed from the second film is formed, the pattern formation unit 18 can form on the formed layer another film that is to be another pattern similarly to the second film. The film that is to be another pattern is formed to have a flat surface in the same manner as in formation of the second film. Thus, the pattern formation unit 18 is not limited for use in formation of the second film that is to be a pattern.

The input unit 30 includes an input device (not shown) used by the operator (user) to enter various inputs, and a display (not shown). As the input device, a variety of devices such as a keyboard, a mouse, a touch panel and a button may be used.

The operator can input through the input unit 30 various processing conditions and various operating conditions for the mark formation unit 12, the detection unit 14, the exposure unit 16 and the pattern formation unit 18 to be stored in the storage unit 34, and also input TFT pattern data (design data) including positional information (arrangement information) of constituent elements of a TFT to be formed and shape information such as the size of the constituent elements of the TFT, as well as positional information of alignment marks M of the substrate Z and shape information such as the size of the alignment marks M, to be stored in the storage unit 34.

The operator can know the states of the mark formation unit 12, the detection unit 14, the exposure unit 16 and the pattern formation unit 18 through the display of the input unit 30. The display also serves as means for displaying the warning such as error messages. In addition, the display serves as alarming means for informing abnormalities.

The drawing data production unit 32 is configured to produce exposure data to be usable by the exposure unit 16 from pattern data for, for instance, each constituent element of a TFT by converting the pattern data entered from the input unit 30, for example, CAD data including the positional information (arrangement information) of each constituent element of the TFT and the shape information such as the size of each constituent element of the TFT into data in a format usable by the exposure unit 16 in irradiating a pattern-formable area with UV light. The exposure unit 16 irradiates the pattern-formable area with UV light in accordance with the exposure data.

The drawing data production unit 32 converts, for instance, TFT pattern data using vector graphics (vector data) into that using raster graphics (raster data). In the case where entered data is in a format usable by the exposure unit 16, such data conversion is dispensable. In this case, pattern data of a TFT or the like may be transmitted to the image processing unit 36 through the drawing data production unit 32 without data conversion or directly to the image processing unit 36 without going through the drawing data production unit 32.

The storage unit 34 is configured to store pattern data, for instance, various kinds of information required to form a pattern of a TFT in the formation apparatus 10. Exemplary information to be entered to the formation apparatus 10 through the input unit 30 is TFT pattern data. The storage unit 34 also stores information on which pattern data, for instance, which constituent element of a TFT the strain information of the substrate produced by the detection unit 14 corresponds to. Furthermore, the storage unit 34 stores setting conditions, processing conditions and the like of each constituent unit of the formation apparatus 10.

The image processing unit 36 is connected to the detection unit 14, the exposure unit 16, the pattern formation unit 18, the drawing data production unit 32 and the storage unit 34, and receives the strain information of the substrate Z produced by the detection unit 14.

The image processing unit 36 is configured to modify the position where a pattern is to be formed on the first film 50 in accordance with the strain information of the substrate Z transmitted from the detection unit 14, and serves as an adjustment unit for the pattern formation.

The image processing unit 36 compares the strain information of the substrate Z with an allowable range and when the strain of the substrate Z exceeds the allowable range, produces corrected exposure data by correcting the exposure data according to the strain information of the substrate Z in order to modify the target position of irradiation with UV light.

When the exposure unit 16 is a digital exposure machine, the image processing unit 36 produces corrected exposure pattern data by correcting the pattern data indicative of the position of a pattern-formable area according to the strain information of the substrate Z. The corrected exposure pattern data is output to the exposure unit 16, and the exposure unit 16 irradiates the pattern-formable area with UV light in accordance with the corrected exposure pattern data to thereby cause the pattern-formable area to be lyophilic. As a result, it is possible to cause the proper position to be lyophilic.

When the inkjet method is used in the pattern formation unit 18, the image processing unit 36 produces corrected jetting pattern data by correcting the jetting pattern data according to the strain information of the substrate Z in order to modify the position where ink droplets are to be jetted in line with the modification of the exposed position. The corrected jetting pattern data is output to the pattern formation unit 18, and the pattern formation unit 18 forms the second film at the pattern-formable area having been caused to be lyophilic in accordance with the corrected jetting pattern data. As a result, the second film can be formed at the appropriate position.

The image processing unit 36 compares the strain information of the substrate Z with the allowable range and when the strain of the substrate Z falls within the allowable range, does not produce corrected exposure data. The exposure data entered to the image processing unit 36 is therefore directly output to the exposure unit 16 without being corrected. The exposure unit 16 irradiates a pattern-formable area with UV light in accordance with the exposure data.

While the formation apparatus 10 in the present embodiment is for use in the roll-to-roll process, it is not limited thereto. The formation apparatus 10 may be of sheet type in which sheets of substrates Z are processed one by one.

The pattern formation method in the present embodiment is capable of forming a micropattern as shown, for instance, in FIGS. 3A to 3F.

Figure 3A:
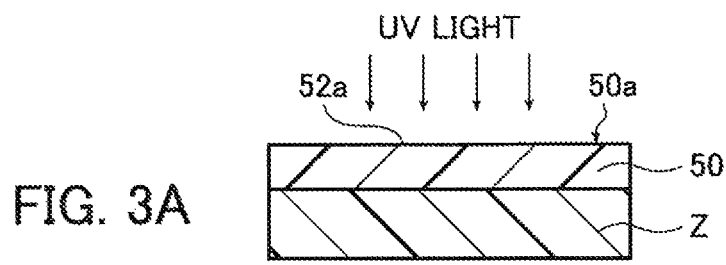
FIGS. 3A to 3F are schematic cross-sectional views showing, in the order of process steps, the pattern formation method according to the embodiment of the invention.
Figure 3B:
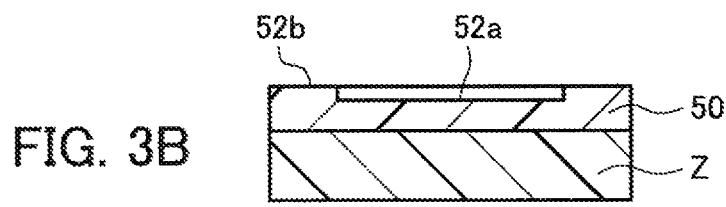

As shown in FIG. 3A, for the substrate Z having formed on its surface the first film 50 being originally liquid-repellent, the exposure unit 16 irradiates a pattern-formable area 52a at which a pattern is to be formed on the surface 50a of the first film 50 with UV light according to exposure data. As a result, the pattern-formable area 52a is caused to be lyophilic and reduced in thickness so that a level difference arises as shown in FIG. 3B. On the surface 50a of the first film 50, the area other than the pattern-formable area 52a is called "pattern-unformable area 52b." The pattern-unformable area 52b is liquid-repellent.

Figure 3C:
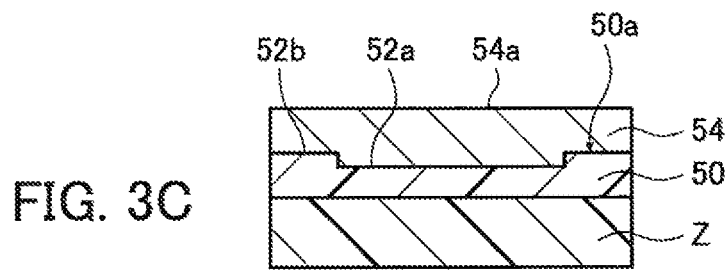

Next, the pattern formation unit 18 is used to form a second film 54 on the whole surface 50a of the first film 50, i.e., on the pattern-formable area 52a and the pattern-unformable area 52b so that the surface 54a thereof is flat, as shown in FIG. 3C. A dispersion of conductive fine particles is for example used as a coating liquid to form the second film 54 having the flat surface.

Figure 3D:
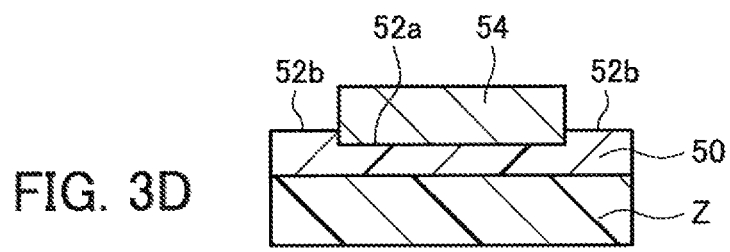
Figure 3E:
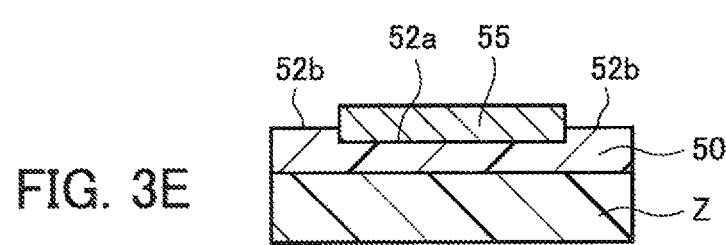

As shown in FIG. 3D, the second film 54 is repelled by the pattern-unformable area 52b and gathers to the pattern-formable area 52a. The second film 54 gathered on the pattern-formable area 52a is, for instance, naturally dried and thereby reduced in thickness, and finally becomes a pattern 55 as shown in FIG. 3E. Thus, an uneven structure is formed. The pattern 55 is composed of a dispersion of conductive fine particles and is therefore lyophilic. The pattern 55 composed of the above-described dispersion may also be used for electric wiring, an electrode for a semiconductor and the like, for example. In those cases, the first film 50 serves as a support or an insulating layer on which electric wiring, an electrode for a semiconductor or the like is formed.

In the above-described uneven structure, a lyophilic convex portion is made up of the pattern 55 while a liquid-repellent concave portion is made up of the remaining area, i.e., the pattern-unformable area 52b of the first film 50.

Figure 3F:
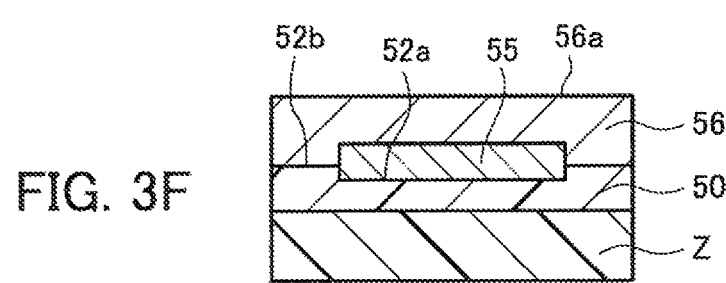

Next, as shown in FIG. 3F, a third film 56 is formed to cover the pattern 55 and the pattern-unformable area 52b so that the surface 56a thereof is flat in the same manner as in formation of the second film 54. The third film 56 is composed of the same liquid-repellent agent as that for the first film 50 and is liquid-repellent. While the third film 56 is formed to extend over both the liquid-repellent concave area and the lyophilic convex area, the third film 56 is formed so that the surface 56a thereof is flat. Therefore, dewetting of the third film 56 is suppressed and the surface 56a of the third film 56 is held flat even after a certain period of time.

When the third film 56 is formed by, for instance, the inkjet method, the amount of ink jetted to the pattern-unformable area 52b (concave portion exhibiting liquid repellency) is adjusted to be larger than that for the pattern 55 (convex portion exhibiting lyophilic properties), thereby forming the third film 56 having the flat surface 56a.

In the present invention, a film surface being flat means that a film surface is substantially flat and the surface of the film formed on a solid substance does not reflect irregularities at the surface of the solid substance. For example, the surface 56a of the third film 56 does not reflect irregularities of the uneven structure including the convex portion made up of the pattern 55 and the concave portion made up of the remaining area, i.e., the pattern-unformable area 52b of the first film 50, and is thus flat. This state is expressed as a film surface being flat. In the same manner, the surface 54a of the second film 54 does not reflect the level difference at the first film 50 and is thus flat. This state is also expressed as a film surface being flat.

Figure 4:
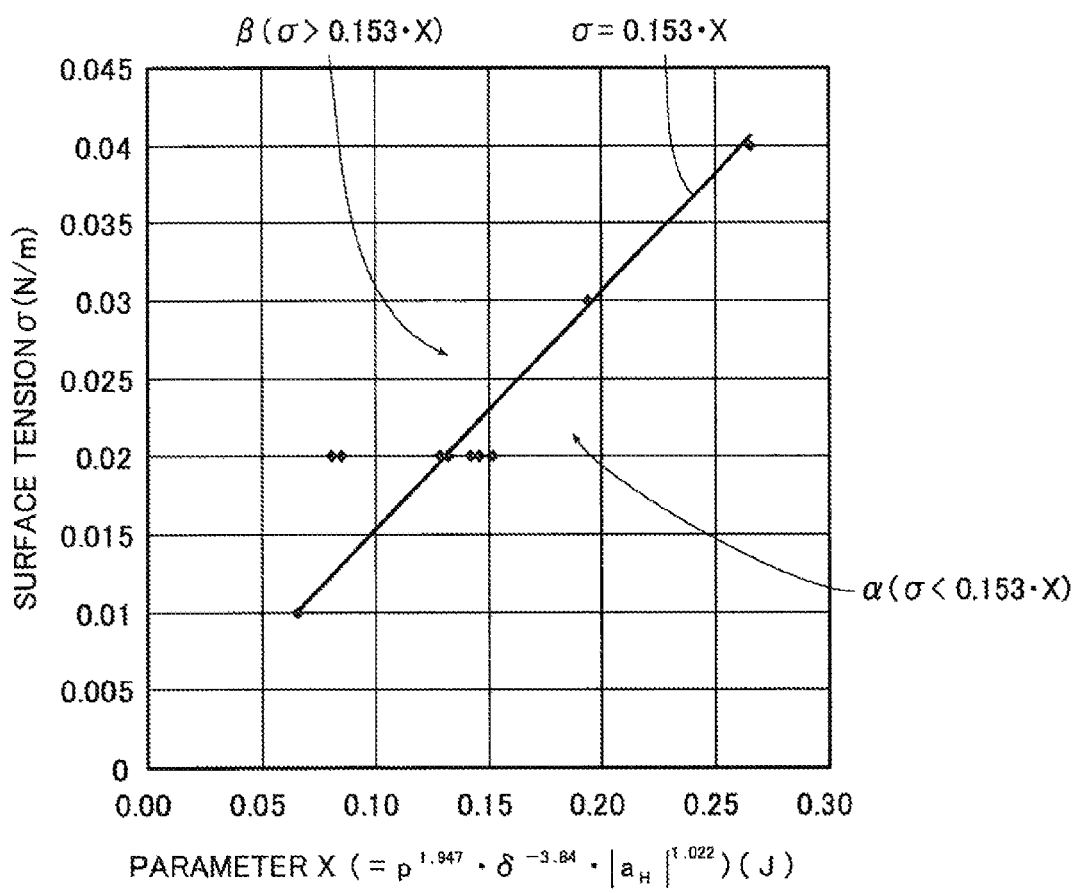
FIG. 4 is a graph illustrating the relationship between the surface tension and dewetting.

In the present embodiment, the third film 56 is preferably formed of a coating liquid that satisfies the following condition in terms of the surface tension σ and the parameter X: σ>0.153·X, where the surface tension is σ (N/m). FIG. 4 shows the relationship between the surface tension σ and the parameter X, and an area β shown in FIG. 4 is an area in which the condition of σ>0.153·X is satisfied.

The second film 54 is preferably formed of a coating liquid, e.g., a dispersion of conductive fine particles, that satisfies the following condition in terms of the surface tension σ and the parameter X: σ<0.153·X. An area α shown in FIG. 4 is an area in which the condition of σ<0.153·X is satisfied.

The parameter X is expressed by the following equation: $X = p^{1.947} \times \delta^{-3.84} \times |a_H|^{1.022}$, where the film thickness is δ (m), the pitch of irregularities is p (m), and the Hamaker constant is $a_H$ (J). The coefficient of 0.153 has a predetermined unit used for converting between the unit of the surface tension σ(N/m) and the unit of the parameter X.

For the third film 56, the term "pitch p of irregularities" refers to the pitch of irregularities made up of the pattern 55 and the pattern-unformable area 52b. Given that the pattern 55 and the pattern-unformable area 52b constitute a line and space pattern, the term "pitch p of irregularities" refers to a total width of one line and one space.

The surface tension σ satisfying the above condition ($\sigma > 0.153\ p^{1.947} \times \delta^{-3.84} \times |a_H|^{1.022}$) further mitigates dewetting tendency. Therefore, it is preferable in the formation of the third film 56 to use a coating liquid having a surface tension σ falling in the area β.

On the other hand, the surface tension σ satisfying the above condition ($\sigma < 0.153\ p^{1.947} \times \delta^{-3.84} \times |a_H|^{1.022}$) further improves dewetting tendency. Therefore, it is preferable in the formation of the second film 54 to use a coating liquid having a surface tension σ falling in the area α. For the second film 54, the term "pitch p of irregularities" refers to the pitch of irregularities made up of the pattern-formable area 52a and the pattern-unformable area 52b. Given that the pattern-formable area 52a and the pattern-unformable area 52b constitute a line and space pattern, the term "pitch p of irregularities" refers to a total width of one line and one space.

The Hamaker constant $a_H$ (J) of, for instance, the second film 54 is determined by the second film 54 and the first film 50 thereunder. The Hamaker constant $a_H$ (J) of the third film 56 is determined by the first film 50 and the pattern 55 (second film 54) under the third film 56.

Thus, the Hamaker constant $a_H$ (J) is determined by films on the upper and lower sides, and plural Hamaker constants may exist depending on a state of a film on the lower side or the like. It has been found that in the above case, among the plural Hamaker constants, a Hamaker constant being negative and whose absolute value is large influences dewetting phenomenon. This means that the physical properties of a lyophobic part controls the entire results of dewetting phenomenon, and the change in a lyophilic part does not greatly influence the entire results. Accordingly, when there are plural Hamaker constants, a Hamaker constant being negative and whose absolute value is the largest among these constants is defined as the Hamaker constant $a_H$ (J) in the foregoing parameter X.

Figure 5:
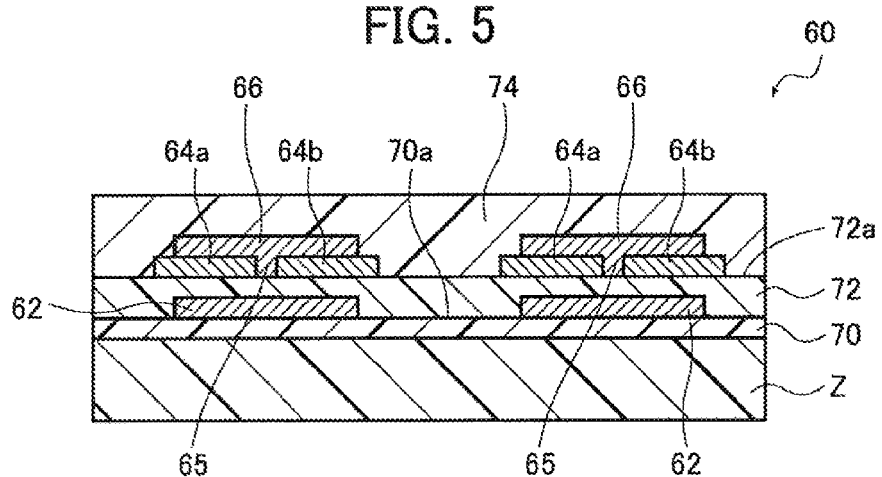
FIG. 5 is a schematic cross-sectional view showing an example of a thin film transistor formed using the pattern formation method according to the embodiment of the invention.

With the use of the pattern formation method of the present embodiment, two TFTs 60 arranged side by side can be formed as shown in FIG. 5, for instance.

The TFTs 60 shown in FIG. 5 have gate electrodes 62, source electrodes 64a, drain electrodes 64b and semiconductor layers 66. The gate electrodes 62, the source electrodes 64a and the drain electrodes 64b in the TFTs 60 can be formed by the above-described method of forming the pattern 55 using the second film 54.

A film 70 is formed on the substrate Z and the TFTs 60 are formed on the film 70. The film 70 is provided for attaining a specified flatness to allow the gate electrodes 62 to be formed thereon and for improving electrical insulating properties. The film 70 corresponds to the first film 50.

In each of the TFTs 60, the gate electrode 62 is formed on the surface 70a of the film 70, and a gate insulating layer 72 is formed to cover the gate electrode 62 and the film 70. The source electrode 64a and the drain electrode 64b are formed on the surface 72a of the gate insulating layer 72 and above the gate electrode 62 so that they are arranged with a specified clearance gap therebetween as a channel area 65. The semiconductor layer 66 serving as an active layer is formed to fill the channel area 65 and also extend over the source electrode 64a and the drain electrode 64b. A protective layer 74 is formed to cover the source electrode 64a, the drain electrode 64b and the semiconductor layer 66.

Also when being formed of the same liquid-repellent agent as that for the film 70, the gate insulating layer 72 and the protective layer 74 each have a thickness of preferably 0.001 μm to 1 μm and most preferably 0.01 to 0.1 μm as with the thickness (film thickness) of the film 70, for instance. The gate insulating layer 72 can be formed by the pattern formation method of the invention, for instance, by using the above-described method of forming the third film 56. According to the pattern formation method of the invention, the gate insulating layer 72 can be formed to have a substantially flat surface.

In the TFTs 60, when the exposure unit 16 of the formation apparatus 10 irradiates gate electrode-formable areas at which the gate electrodes 62 are to be formed on the surface 70a of the film 70 with ultraviolet light, the irradiated areas are reduced in thickness and recessed while being caused to be lyophilic. Other areas than the gate electrode-formable areas on the surface 70a of the film 70 exhibit liquid repellency.

Next, the pattern formation unit 18 forms, over the whole surface 70a of the film 70, an electrode film (not shown) that is to be the gate electrodes 62 so that the surface of the electrode film is flat. The electrode film is composed of a dispersion of conductive fine particles, for instance.

Thereafter, the electrode film is repelled by pattern-unformable areas and gathers to the gate electrode-formable areas in a short time. Then, the electrode film is dried, whereby the gate electrodes 62 are formed on the gate electrode-formable areas. In this example, there is formed an uneven structure including convex portions exhibiting lyophilic properties that are made up of the gate electrodes 62 and concave portions exhibiting liquid repellency that are made up of the remaining areas, i.e., the pattern-unformable areas of the film 70. The foregoing electrode film (dispersion described above) preferably has a surface tension σ satisfying the condition of σ<0.153·X.

The formation apparatus 10 does not have the function of forming an insulating layer, so that the gate insulating layer 72 is formed using another device. The gate insulating layer 72 is also composed of the liquid-repellent agent having the lyophilic/lyophobic variable function to allow lyophilic/lyophobic properties to vary and allow the reduction in film thickness to occur upon exposure to ultraviolet light as with the film 70, for example.

When the gate insulating layer 72 is formed, an insulating film (not shown) that is to be the gate insulating layer 72 is formed to cover the gate electrodes 62 and extend over the whole surface of the film 70. At this time, the insulating film is formed by, for instance, the inkjet method in which the amount of ink jetted to the surface of the film 70 at the other areas (concave portions exhibiting liquid repellency) than the gate electrodes 62 (convex portions exhibiting lyophilic properties) is adjusted to be larger than that for the gate electrodes 62 (convex portions exhibiting lyophilic properties), thereby forming the insulating film having a flat surface in the same manner as in formation of the third film 56 (see FIG. 3F) above. Dewetting of the insulating film is suppressed, and the surface of the insulating film is held flat without being affected by liquid repellency of the film 70 and lyophilic properties of the gate electrodes 62, similarly to the above-described third film 56 (see FIG. 3F). Then, the insulating film is dried, whereby the gate insulating layer 72 having the flat surface is formed. The insulating film preferably has a surface tension σ satisfying the condition of σ>0.153·X.

Next, the exposure unit 16 of the formation apparatus 10 causes formation areas at which the source electrodes 64a and the drain electrodes 64b are to be formed on the surface 72a of the gate insulating layer 72 to be lyophilic and to reduce in thickness and be recessed, so that level differences arise. Then, in the same manner as in formation of the gate electrodes 62, an electrode film (not shown) is formed on the formation areas to form the source electrodes 64a and the drain electrodes 64b. The electrode film preferably has a surface tension σ satisfying the condition of σ<0.153·X.

Thereafter, uncovered portions of the surface 72a of the gate insulating layer 72 which are the channel areas 65 are caused to be lyophilic and to reduce in thickness and be recessed, so that level differences arise in the same manner as described above. Then, a semiconductor film (not shown) that is to be the semiconductor layers 66 is formed to fill the channel areas 65 and also extend over the source electrodes 64a and the drain electrodes 64b. The semiconductor film preferably has a surface tension σ satisfying the condition of σ<0.153·X.

Subsequently, another device is used to form the protective layer 74 made of resin on the surface 72a of the gate insulating layer 72 so as to cover the source electrodes 64a and the drain electrodes 64b as well as the semiconductor layer 66. Nothing is formed on the protective layer 74, and the protective layer 74 therefore need not be composed of, for example, the liquid-repellent agent having the lyophilic/lyophobic variable function to allow lyophilic/lyophobic properties to vary and allow the reduction in film thickness to occur upon exposure to ultraviolet light as used for the film 70.

According to the pattern formation method in this embodiment, a gate insulating layer 72 having a flat surface can be formed, and this leads to higher accuracy in terms of position and shape of gate electrodes 62 and source electrodes 64a to be formed on the gate insulating layer 72. Therefore, the dimension error of channel areas of TFTs in width is small and hence, the characteristic variance among the TFTs can be suppressed. Furthermore, a process of flattening the surface of the gate insulating layer 72 is unnecessary, which also improves the productivity.

In the present invention, the behavior of liquid films formed on the above-described pattern-unformable area and pattern-formable area was examined using three analysis models to be described below in detail.

Figure 6A:
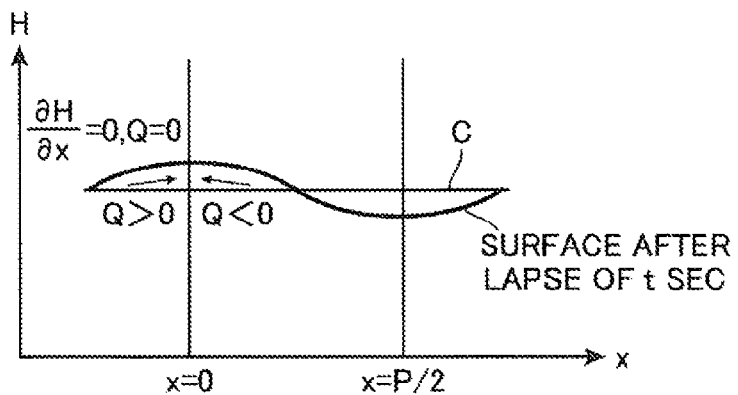
FIG. 6A is a schematic view illustrating dewetting of a liquid film.
Figure 6B:
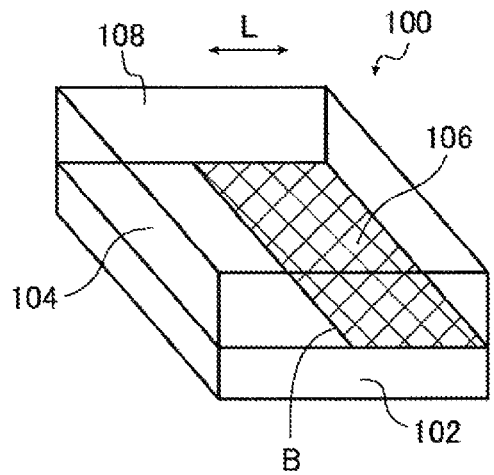
FIG. 6B is a perspective view schematically showing a first analysis model of dewetting of the liquid film.
Figure 7A:
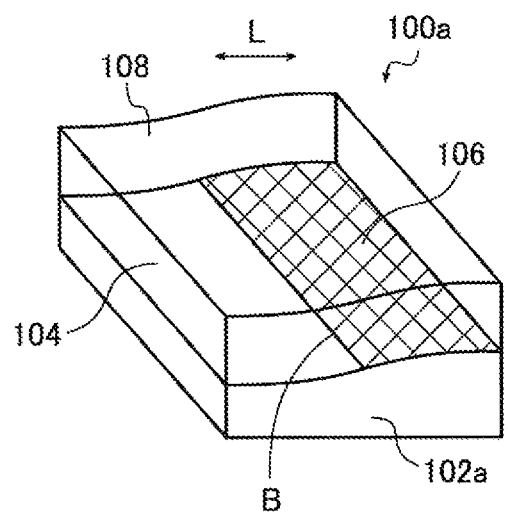
FIG. 7A is a perspective view schematically showing a second analysis model of dewetting of the liquid film.
Figure 8A:
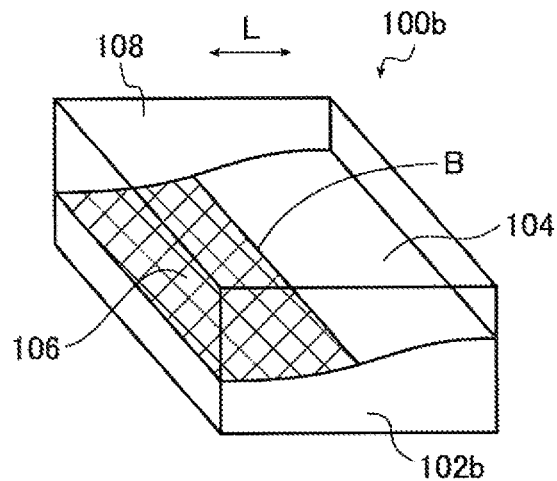
FIG. 8A is a perspective view schematically showing a third analysis model of dewetting of the liquid film.

Note that the common constituent elements in a first analysis model 100 through a third analysis model 100b are assigned by the same reference symbols in FIGS. 6B, 7A and 8A. The third analysis model 100b corresponds to the pattern formation method of the invention; and the first and second analysis models 100 and 100a correspond to conventional pattern formation methods.

Specifically, as shown in FIG. 6A, those models are for use in analysis on how the state of the initial surface C of a second film varies after a lapse of predetermined time. The term "initial surface" used herein refers to a surface at the time when the second film has been just formed.

The first analysis model 100 shown in FIG. 6B was used for the analysis of FIG. 6A. In the first analysis model 100, the surface of a support 102 corresponding to the first film 50 is separated into a lyophilic portion 104 and a liquid-repellent portion 106, and a liquid film 108 having a uniform thickness corresponding to the second film 54 is formed on the support 102. The surface of the support 102 is flat and the surface of the liquid film 108 is also flat. Reference symbol B indicates the boundary between the lyophilic portion 104 and the liquid-repellent portion 106.

Figure 6C:
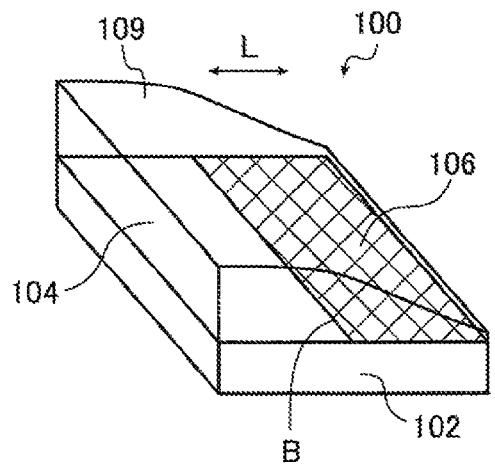
FIG. 6C is a perspective view schematically showing the change in film thickness of the liquid film due to dewetting in the first analysis model.

For example, when the liquid-repellent portion 106 repels the liquid film 108, the liquid film 108 flows and changes into a liquid film 109 in the state shown in FIG. 6C. Thus, the flow of the liquid film 108 caused by the lyophilic portion 104 and the liquid-repellent portion 106 was analyzed through simulation.

In the first analysis model 100 shown in FIG. 6B, the distance from the end at the lyophilic portion 104 side to the end at the liquid-repellent portion 106 side in the width direction L is defined as ½ pitch, where 1 pitch is 30 μm.

Next, the second analysis mode 100a shown in FIG. 7A is described.

In the second analysis model 100a, a support 102a corresponding to the first film 50 has the surface that is not flat but is in the shape of cosine curve as compared to the first analysis model 100 shown in FIG. 6B. The surface of the support 102a is separated into a lyophilic portion 104 and a liquid-repellent portion 106, and a convex area is defined as the liquid-repellent portion 106. The support 102a is what a pattern-formable area having a small film thickness and a pattern-unformable area are modeled.

A liquid film 108 having a uniform thickness corresponding to the second film 54 is formed on the support 102, and in the second analysis model 100a, the liquid film 108 has a cosine curve-shaped surface in accordance with the support 102a.

Figure 7B:
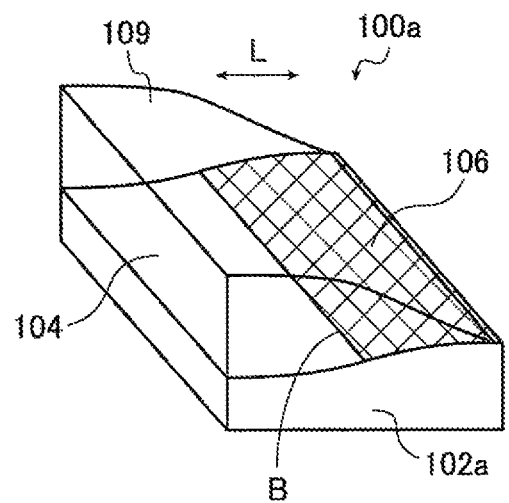
FIG. 7B is a perspective view schematically showing the change in film thickness of the liquid film due to dewetting in the second analysis model.

In the second analysis model 100a, for example, when the liquid-repellent portion 106 repels the liquid film 108, the liquid film 108 flows and changes into a liquid film 109 in the state shown in FIG. 7B. Also in the second analysis model 100a, as with the first analysis model 100 shown in FIG. 6B, the flow of the liquid film 108 was analyzed through simulation.

Next, the third analysis model 100b shown in FIG. 8A is described.

As compared to the second analysis model 100a shown in FIG. 7A, the third analysis model 100b has the same structure as the second analysis model 100a shown in FIG. 7B except that a concave area at the surface of a support 102b is defined as a liquid-repellent portion 106 while a convex area is defined as a lyophilic portion 104 and that a liquid film 108 formed on the support 102b has a flat surface.

Figure 8B:
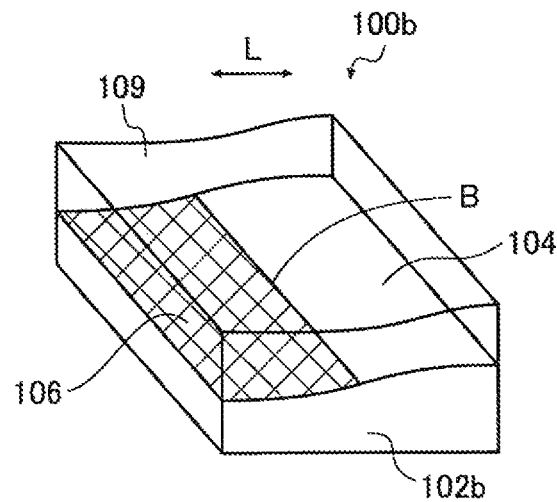
FIG. 8B is a perspective view schematically showing the change in film thickness of the liquid film due to dewetting in the third analysis model.

In the third analysis model 100b, for example, after the liquid film 108 is formed, the liquid film 108 flows and changes into a liquid film 109 in the state shown in FIG. 8B. Also in the third analysis model 100b, as with the first analysis model 100 shown in FIG. 6B, the flow of the liquid film 108 was analyzed through simulation.

For the analysis on the flow of the liquid films 108 of the first analysis model 100 to the third analysis model 100b, Equations 1 to 4 shown below are combined to formulate a fourth-order partial differential equation for a surface position h of each liquid film 108. The reduction in film thickness and dewetting caused by inter-surface force of a flat liquid film in the initial state can be obtained by numerically solving the partial differential equation, for instance, with periodic boundary conditions. In the present embodiment, the dewetting time was calculated.

The dewetting time is a period of time from the initial state until the film thickness at the end at the liquid-repellent portion 106 side becomes zero in simulation.

Figure 9:
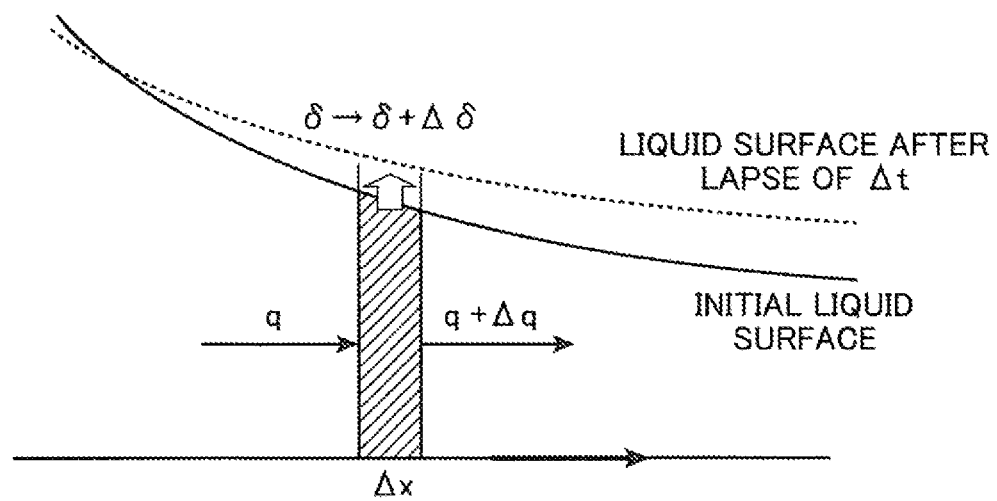
FIG. 9 is a schematic view showing the relationship between film thickness change and a flow rate as used in analyzing dewetting.

Equation 1 below expresses temporal change of the surface of a liquid film 108, and Equation 2 below expresses the relationship between film thickness change and a flow rate shown in FIG. 9.

"$\delta$" in Equations 1 to 4 below represents the thickness of a liquid film 108, and "$\delta_B$" in Equation 3 below represents the uneven profile of the supports 102a and 102b. When the support 102 is flat, $\delta_B=0$. "Amp" in Equations 3 and 6 below represents a coefficient indicative of the degree of amplitude.

As to the film thickness $\delta$ of a liquid film 108, when the surface of a liquid film 108 is not flat, the film thickness $\delta$ of the liquid film 108 in the initial state (t=0 second) is equal to the average thickness $\delta_{avr}$ as shown in Equation 5 below. That is, the surface position h of the liquid film 108 is to be a variable value.

On the other hand, when the surface of a liquid film 108 is flat, the film thickness of the liquid film 108 in the initial state (t=0 second) is equal to a value obtained by adding a thickness variation to the average thickness $\delta_{avr}$ as shown in Equation 6 below. That is, the surface position h of the liquid film 108 is to be a value of the average thickness $\delta_{avr}$. For the film thickness $\delta$ and the surface position h of a liquid film 108, initial conditions were thus modified depending on the analysis model.

$$\frac{\partial \delta}{\partial t} = -\frac{\partial q}{\partial x} \qquad [\text{Equation 1}]$$

$$\frac{\partial p}{\partial x} = \rho g \frac{dh}{dx} - \sigma \frac{d^3 h}{dx^3} - \frac{1}{6\pi\delta^3}\frac{da_H}{dx} + \frac{a_H}{2\pi\delta^4}\frac{dh}{dx} \qquad [\text{Equation 2}]$$

$$h = \delta + \delta_B \qquad [\text{Equation 3}]$$
$$\delta_B = -\text{Amp}\cos(2\pi x/p)$$

$$q = \int_0^\delta u\,dy \qquad [\text{Equation 4}]$$
$$= -\frac{1}{3}\left(\frac{\partial p}{\partial x}\right)\delta^3$$

When $t = 0$, [Equation 5]
$\delta = \delta_{avr}$

When $t = 0$, [Equation 6]
$\delta = \delta_{avr} + \text{Amp}\cos(2\pi x/p)$

Inter-surface force Π can be obtained by Equation 7 below. "$a_H$" in Equation 2 above and Equation 7 below represents the Hamaker constant. The Hamaker constant is expressed by Equation 8 below according to A. Sharma and G. Reiter (1996).

$$\Pi = \frac{a_H}{6\pi h^3} \quad \text{[Equation 7]}$$

$$a_H = -12\pi d_0^2 S^d \quad \text{[Equation 8]}$$

"$d_0$" in Equation 8 above represents a cutoff distance, where 0.158 nm is given. "$S^d$" is expressed by Equation 9 below, and "$\gamma_L^d$" and "$\gamma_S^d$" in Equation 9 below are obtained by measuring the contact angle.

$$S^d = 2\sqrt{\gamma_L^d}(\sqrt{\gamma_S^d} - \sqrt{\gamma_L^d}) \quad \text{[Equation 9]}$$

Figure 10:
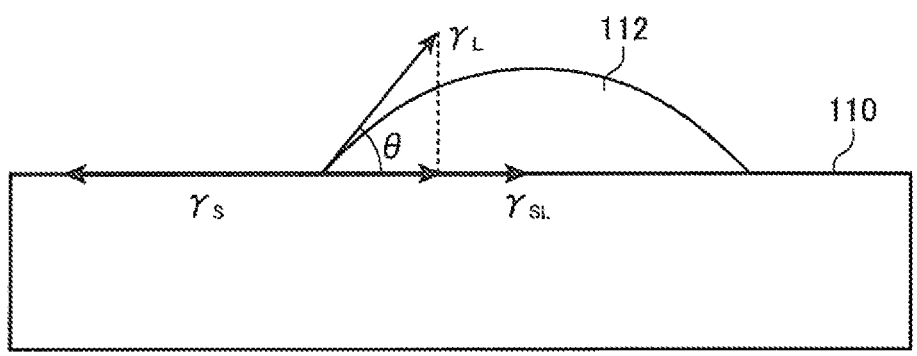
FIG. 10 is a schematic view illustrating Young's equation.

When a droplet 112 is present on a surface of a solid substance 110 and the droplet 112 is in equilibrium as shown in FIG. 10, the surface tension ($\gamma_S$) of the solid, the interfacial tension ($\gamma_{SL}$) between the solid and the liquid, and the surface tension ($\gamma_L$) of the liquid establish the relationship of Young's equation expressed by Equation 10 below. "$\theta$" represents the contact angle.

$$\gamma_L \cdot \cos\theta = \gamma_S - \gamma_{SL} \quad \text{[Equation 10]}$$

Equation 9 below can be obtained according to D. K. Owens and R. C. Wendt (Journal of Applied Polymer Science, Vol. 13, p. 1741, (1969)). "$\gamma_L^d$" and "$\gamma_S^d$" can be obtained from Equation 11 below by measuring the contact angle θ, and this makes it possible to determine the Hamaker constant $a_H$ expressed by Equation 8 above.

$$1 + \cos\theta = 2\sqrt{\gamma_S^d}\left(\frac{\sqrt{\gamma_L^d}}{\gamma_L}\right) + 2\sqrt{\gamma_S^h}\left(\frac{\sqrt{\gamma_L^h}}{\gamma_L}\right) \quad \text{[Equation 11]}$$

$\gamma_L^d$: Liquid-side dispersion force component
$\gamma_S^d$: Solid-side dispersion force component
$\gamma_L^h$: Liquid-side non-dispersion force component
$\gamma_S^h$: Solid-side non-dispersion force component In numerical analysis, the calculation area was set to ½ pitch from the end at the lyophilic portion 104 side to the end at the liquid-repellent portion 106 side. Specifically, the analysis range in each of the analysis models 100 to 100b was set to a range from the end at the lyophilic portion 104 side to the end at the liquid-repellent portion 106 side in the width direction L with the center on a boundary B.

A difference method (time Euler method) was employed for the calculation algorithm. A third order differential coefficient was given with seven-point difference, and a first order differential coefficient was given with five-point difference. Area division was set to the division into forty segments.

Basic calculation conditions were set so that the liquid film 108 had a viscosity of 1 mPa·s, a density of 1000 kg/m³, a surface tension of 20 mN/m and a thickness δ of 0.1 μm, and the calculation area was 15 μm. The Hamaker constant $a_H$ was set to $-5.0 \times 10^{-19}$ (J).

The irregularities at each of the supports 102a and 102b are represented by "$\delta_H$" in Equation 3 above. The level difference of the irregularities in the calculation area was set to plus or minus 10 nm at a maximum. That is, the value of Amp was set to 10.

In the present embodiment, when the foregoing partial differential equation is solved, conditions are given as described above, for instance. However, conditions used in solving the foregoing partial differential equation are not limited thereto.

Figure 11A:
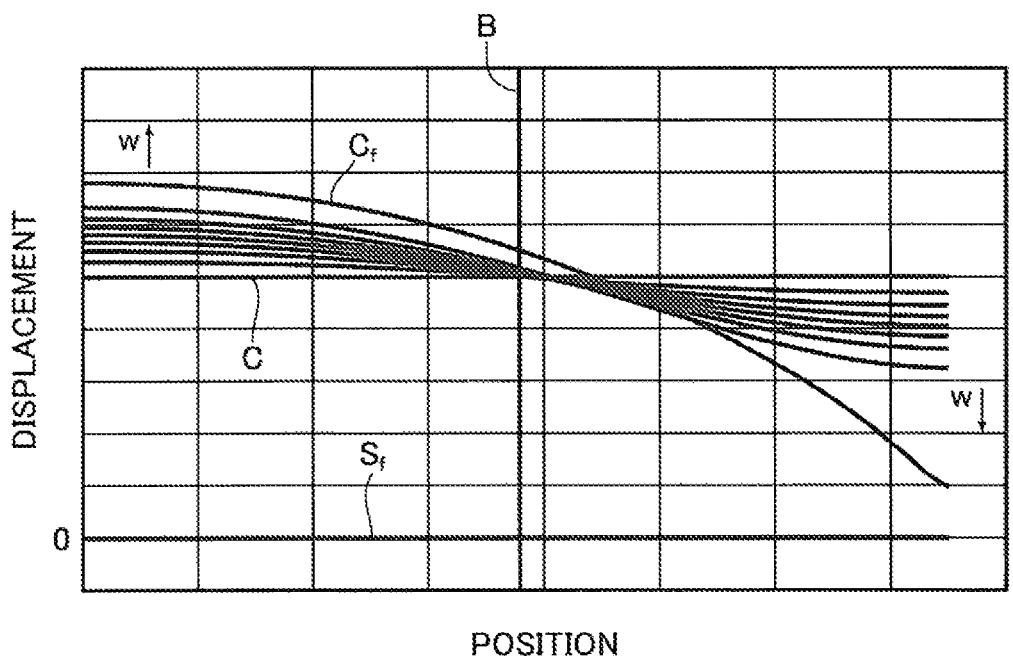
FIGS. 11A and 11B are graphs showing film thickness distributions obtained by analyses.
Figure 11B:
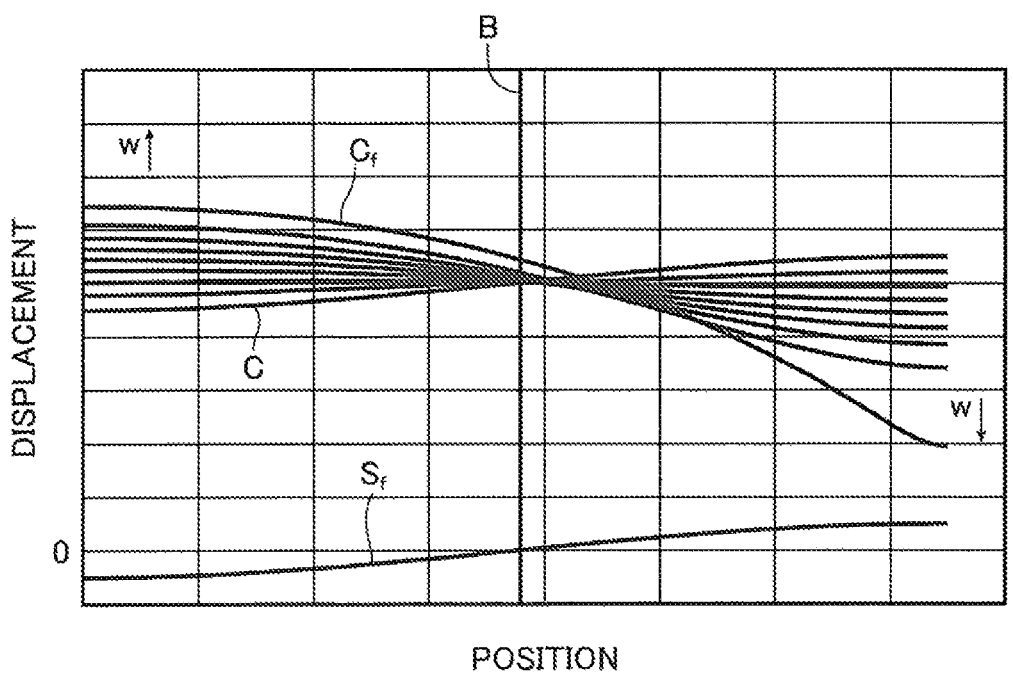
Figure 14A:
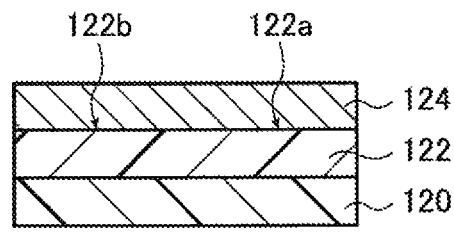
FIGS. 14A and 14B are schematic cross-sectional views showing, in the order of process steps, a conventional pattern formation method.
Figure 14B:
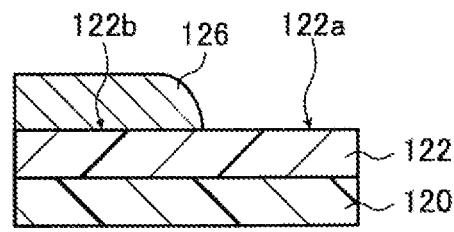

The results of numerical analysis of the analysis models 100 to 100b are shown in FIGS. 11A and 11B and FIG. 12. FIG. 11A, FIG. 11B and FIG. 12 show the results of the first analysis model 100, the second analysis model 100a and the third analysis model 100b, respectively.

Reference symbol $S_f$ shown in FIGS. 11A and 11B and FIG. 12 represents the surface profile of each support, and reference symbol w represents a time direction used in calculation.

Reference symbol C shown in FIGS. 11A and 11B and FIG. 12 represents the surface profile of each liquid film 108 in the initial state, and reference symbol $C_f$ represents the surface profile of each liquid film 108 in the dewetting state. In FIGS. 11A and 11B and FIG. 12, the left side of the boundary B is the liquid-repellent portion 106 while the right side thereof is the lyophilic portion 104.

The results of dewetting time of the first to third analysis models 100 to 100b are shown in Table 1 below. The mark "∞" (infinity) in the dewetting time field of the third analysis model 100b in Table 1 below indicates not repelling.

TABLE 1

| Analysis model | Dewetting time (sec) |
| --- | --- |
| First analysis model (coated on flat surface) | 0.495 |
| Second analysis model (uneven profile, uniform film thickness) | 0.21 |
| Third analysis model (uneven profile, coated to be flat (liquid-repellent at convex portion)) | ∞ |

As is clear from FIGS. 11A and 11B and Table 1, with the conventional pattern formation method, a liquid film is repelled and the liquid film surface cannot be held substantially flat. On the other hand, as is clear from FIG. 12 and Table 1, by exchanging the liquid-repellent portion and the lyophilic portion in position on a support having irregularities, dewetting of a liquid film is inhibited and the change of the liquid film surface can be suppressed. Accordingly, the liquid film surface is held substantially flat. Thus it is possible to form a film having a substantially flat surface without being affected by a liquid-repellent portion and a lyophilic portion.

Hereinafter, materials of the second film used in forming wiring of electronic circuits and constituent elements of electron devices such as TFTs, as well as precursors thereof, are specifically described.

Conductive materials used for the second film include conductive fine particles, and the conductive fine particles preferably have a particle size of at least 1 nm but up to 100 nm. When conductive fine particles have a particle size in excess of 100 nm, nozzle clogging tends to be caused and this makes discharge by the inkjet method difficult. When conductive fine particles have a particle size of less than 1 nm, the volume ratio of a coating agent to conductive fine particles increases and the ratio of an organic substance in a resultant film is to be excessive.

The dispersoid concentration is preferably at least 1 wt % but up to 80 wt % from the viewpoint of coagulation properties of dispersoid concentration.

The surface tension of a dispersion of the conductive fine particles is preferably at least 20 mN/m but up to 70 mN/m. When a liquid is discharged in the inkjet method, at a surface tension of less than 20 mN/m, the wettability of an ink composition increases with respect to a nozzle face, whereby discharged ink tends to be deflected from the expected trajectory, while at a surface tension in excess of 70 mN/m, the shape of meniscus at a nozzle tip is unstable, and this makes the control of the discharge rate and discharge timing difficult.

One exemplary conductive material is a material containing silver fine particles. Examples of other metals constituting fine particles than silver include gold, platinum, copper, palladium, rhodium, osmium, ruthenium, iridium, iron, tin, zinc, cobalt, nickel, chromium, titanium, tantalum, tungsten and indium. Of these, one metal or an alloy composed of two or more metals may be used. In addition, a silver halide may be used. In this case, silver nanoparticles are preferred. In addition to metal fine particles, conductive polymer fine particles and superconductor fine particles may be used.

Examples of a coating agent to be applied on surfaces of the conductive fine particles include organic solvents such as xylene and toluene, and citric acid.

A dispersion medium to be used is not particularly limited as long as it allows the conductive fine particles described above to be dispersed therein and does not cause agglomeration. Examples of the dispersion medium include, in addition to water, alcohols such as methanol, ethanol, propanol and butanol; hydrocarbon compounds such as n-heptane, n-octane, decane, toluene, xylene, cymene, durene, indene, dipentene, tetrahydronaphthalene, decahydronaphthalene and cyclohexylbenzene; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether and p-dioxane; and polar compounds such as propylene carbonate, γ-butyrolactone, N-methyl-2-pyrrolidone, dimethylformamide, dimethylsulfoxide and cyclohexanone. Of these, water, alcohols, hydrocarbon compounds and ether compounds are preferred, and water and hydrocarbon compounds are further preferred as a dispersion medium in terms of the dispersibility of fine particles, the stability of a dispersion, and ease of application to the inkjet method. These dispersion media may be used alone or in combination of two or more as a mixture.

Binders (additives) such as alkyd resin, modified alkyd resin, modified epoxy resin, urethanated oil, urethane resin, rosin resin, rosin oil, maleic acid resin, maleic anhydride resin, polybutene resin, diallyl phthalate resin, polyester resin, polyester oligomer, mineral oil, vegetable oil, urethane oligomer, a copolymer of (meth)allyl ether and maleic anhydride (which copolymer may contain another monomer (e.g., styrene) as a copolymerization component) may be used alone or in combination of two or more. Additives such as a dispersant, a wetting agent, a thickener, a leveling agent, an anti-scumming agent, a gelling agent, silicone oil, silicone resin, an anti-foaming agent and a plasticizer may be appropriately selected and added to a metal paste to be used in the present invention.

As a solvent, normal paraffin, isoparaffin, naphthene and alkylbenzenes may also be used.

The conductive material for use may also be a conductive organic material, and for instance, polymeric soluble materials such as polyaniline, polythiophene and polyphenylene vinylene may also be contained.

An organic metal compound may be contained in place of metal fine particles. The organic metal compound herein is a compound that allows metal to be deposited through decomposition upon heating. Examples of such an organic metal compound include chlorotriethylphosphinegold, chlorotrimethylphosphinegold, chlorotriphenylphosphinegold, silver 2,4-pentanedionate complex, trimethylphosphine(hexafluoroacetylacetonate) silver complex and copper hexafluoropentanedionatocyclooctadiene complex.

Other examples of the conductive fine particles include a resist, acrylic resin as a linear insulating material, silane compounds (e.g., trisilane, pentasilane, cyclotrisilane, 1,1'-biscyclobutasilane) that are to be silicone by heating, and a metal complex. These may be present in a liquid in a dispersed form as fine particles or a dissolved form.

Furthermore, as a liquid containing the conductive organic material, use may be made of an aqueous solution of PEDOT (polyethylenedioxythiophene)/PPS (polystyrene sulfonate) being a conductive polymer; and an aqueous solution of a conductive polymer which is doped PANI (polyaniline) or PEDOT (polyethylenedioxythiophene) doped with PSS (polystyrene sulfonate).

Materials constituting the semiconductor layer 66 include inorganic semiconductors such as CdSe, CdTe, GaAs, InP, Si, Ge, carbon nanotubes, silicones and ZnO; and organic semiconductors such as organic low molecular compounds including pentacene, anthracene, tetracene and phthalocyanine, polyacetylene conductive polymers, polyphenylene conductive polymers including polyparaphenylene and its derivatives and polyphenylene vinylene and its derivatives, heterocyclic conductive polymers including polypyrrole and its derivatives, polythiophene and its derivatives and polyfuran and its derivatives, and ionic conductive polymers including polyaniline and its derivatives.

When the gate insulating layer 72 is not the same as the film 70 in composition, or when a material having high electrical insulating properties that constitutes an interlayer insulating film like the protective layer 74 is used, the following materials may be used. Specifically, exemplary materials include organic materials such as polyimide, polyamide-imide, epoxy resin, silsesquioxane, polyvinylphenol, polycarbonate, fluororesin, poly-para-xylylene and polyvinyl butyral. Polyvinylphenol and polyvinyl alcohol may be crosslinked with a suitable crosslinking agent. Use may be made of fluorinated polymers such as fluorinated polyxylene, fluorinated polyimide, fluorinated polyarylether, polytetrafluoroethylene, polychlorotrifluoroethylene, poly(α,α,α',α'-tetrafluoroparaxylene), poly(ethylene/tetrafluoroethylene), poly(ethylene/chlorotrifluoroethylene) and fluorinated ethylene/propylene copolymer; and polyolefin polymers, as well as polystyrene, poly(α-methylstyrene), poly(α-vinylnaphthalene), polyvinyltoluene, polybutadiene, polyisoprene, poly(4-methyl-1-pentene), poly(2-methyl-1,3-butadiene), poly-para-xylene, poly[1,1-(2-methylpropane)bis(4-phenyl)carbonate], polycyclohexyl methacrylate, polychlorostyrene, poly(2,6-dimethyl-1,4-phenylene ether), polyvinylcyclohexane, polyarylene ether, polyphenylene, polystyrene-co-α-methylstyrene, ethylene/ethyl acrylate copolymers, poly(styrene/butadiene) and poly(styrene/2,4-dimethylstyrene).

Illustrative materials of a porous insulating film include phosphosilicate glass formed of silicon dioxide to which phosphorus is added, borophosphosilicate glass formed of silicon dioxide to which phosphorus and boron are added, polyimide and polyacryl. Furthermore, a porous insulating film having a siloxane bond, such as porous methylsilsesquioxane, porous hydrosilsesquioxane and porous methylhydrosilsesquioxane, may be formed.

Next, materials of the first film 50 and the third film 56 are described.

For instance, a photocatalyst-containing material may be used for the first film 50 and the third film 56. In this case, the photocatalyst-containing material contains fluorine. When the first film (photocatalyst-containing layer) composed of the photocatalyst-containing material is irradiated with energy, the fluorine content at the surface of the photocatalyst-containing material is decreased by action of a photocatalyst compared to before energy irradiation, and the volume of the area irradiated with energy is decreased. Alternatively, the photocatalyst-containing layer may contain a decomposition material that is decomposed by action of a photocatalyst upon energy irradiation, whereby the wettability on the photocatalyst-containing layer is caused to vary and the volume of the area irradiated with energy is decreased.

A photocatalyst, a binder and other components of such a photocatalyst-containing material are described below.

The photocatalyst is described first. Exemplary photocatalysts to be used in the present embodiment include titanium dioxide ($TiO_2$), zinc oxide (ZnO), tin oxide ($SnO_2$), strontium titanate ($SrTiO_3$), tungsten oxide ($WO_3$), bismuth oxide ($Bi_2O_3$) and iron oxide ($Fe_2O_3$) known as optical semiconductors. These may be used alone or in combination of two or more.

In particular, titanium dioxide is advantageously used because it is high in band gap energy, chemically stable, non-toxic and easily available. Titanium dioxide is classified into anatase type or rutile type, and the both types are applicable in the present embodiment. However, anatase-type titanium dioxide is preferred. Anatase-type titanium dioxide has an excitation wavelength of up to 380 nm.

Examples of such anatase-type titanium dioxide include a hydrochloric acid deflocculation-type, anatase-type titania sol (STS-02 (average particle size: 7 nm) available from Ishihara Sangyo Kaisha, Ltd.; ST-K01 available from Ishihara Sangyo Kaisha, Ltd.), and a nitric acid deflocculation-type, anatase-type titania sol (TA-15 (average particle size: 12 nm) available from Nissan Chemical Industries, Ltd.).

A photocatalyst preferably has a smaller particle size because photocatalytic reaction more effectively takes place. The photocatalyst for use has an average particle size of preferably up to 50 nm and most preferably up to 20 nm.

The photocatalyst content in the photocatalyst-containing layer may be set to fall within a range of 5 to 60 wt % and preferably 20 to 40 wt %. The thickness of the photocatalyst-containing layer is preferably within a range of 0.05 to 10 μm.

The binder is described next. There are three embodiments involving a first embodiment in which a photocatalyst acts on a binder itself, whereby the wettability on the photocatalyst-containing layer varies; a second embodiment in which a decomposition material contained in the photocatalyst-containing layer is decomposed by action of a photocatalyst upon energy irradiation, whereby the wettability on the photocatalyst-containing layer is caused to vary; and a third embodiment which is a combination of the above two embodiments. A binder used in the first and third embodiments needs to have the function of causing the wettability on the photocatalyst-containing layer to vary by action of a photocatalyst, while a binder used in the second embodiment does not need such a function.

A binder used in the second embodiment which does not need the function of causing the wettability on the photocatalyst-containing layer to vary by action of a photocatalyst is not particularly limited as long as it has a high bond energy to such an extent that the main skeleton is prevented from being decomposed upon photoexcitation of the photocatalyst described above. One specific example thereof is a polysiloxane having no organic substituent or some quantity of organic substituents, and such a polysiloxane can be obtained by subjecting tetramethoxysilane, tetraethoxysilane or the like to hydrolysis and polycondensation.

When such a binder is used, it is essential for the photocatalyst-containing layer to contain, as an additive, a decomposition material that is decomposed by action of a photocatalyst upon energy irradiation to be described later, whereby the wettability on the photocatalyst-containing layer is caused to vary.

Next, a binder used in the first and third embodiments which needs to have the function of causing the wettability on the photocatalyst-containing layer to vary by action of a photocatalyst is described. A preferred binder to be used here has a high bond energy to such an extent that the main skeleton is prevented from being decomposed upon photoexcitation of the photocatalyst and also includes an organic substituent that is decomposed by action of a photocatalyst. Examples of such a binder include an organopolysiloxane exhibiting high strength that is obtained by subjecting chlorosilane, alkoxysilane or the like to hydrolysis and polycondensation using sol-gel reaction or the like, and an organopolysiloxane that is obtained by crosslinking reactive silicone excellent in water and oil repellency.

In the case of using an organopolysiloxane exhibiting high strength that is obtained by subjecting chlorosilane, alkoxysilane or the like to hydrolysis and polycondensation using sol-gel reaction or the like as described above, the organopolysiloxane is preferably a hydrolysis condensate or a cohydrolysis condensate of one or more than one silicon compound expressed by the general formula: $Y_nSiX_{(4-n)}$ (where Y denotes alkyl group, fluoroalkyl group, vinyl group, amino group, phenyl group or epoxy group; X denotes alkoxy group, acetyl group or halogen; and n is an integer of 0 to 3). The number of carbon atoms of group denoted by Y preferably ranges from 1 to 20, and alkoxy group denoted by X is preferably methoxy group, ethoxy group, propoxy group or butoxy group.

As a binder, a polysiloxane having a fluoroalkyl group is particularly preferred for use. More specifically, use may be made of a hydrolysis condensate or a cohydrolysis condensate of one or more than one of fluoroalkylsilanes shown below, and one generally known as a fluorine-based silane coupling agent may be used.

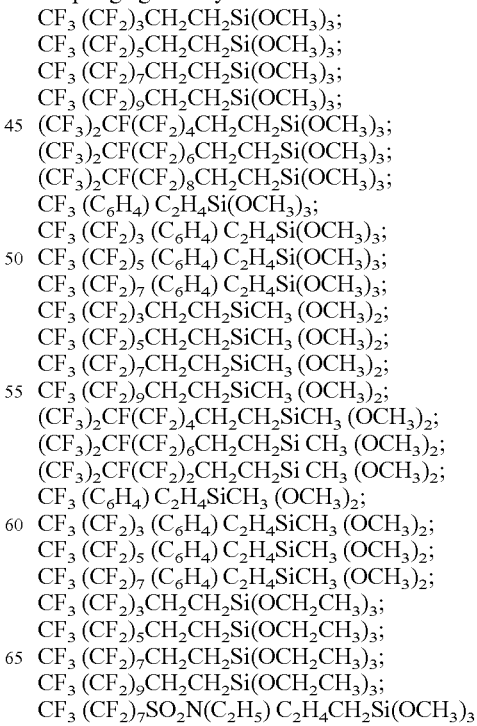

When the above-described polysiloxane having a fluoroalkyl group is used for a binder, a portion unexposed to energy irradiation on the photocatalyst-containing layer greatly improves in liquid repellency, and exhibits the function of preventing a metal paste from adhering.

One example of the reactive silicone excellent in water and oil repellency described above is a compound having a skeleton expressed by the following general formula:

[Chemical Formula 1]

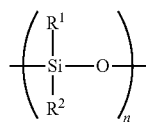

Herein, n is an integer of at least 2, $R^1$ and $R^2$ each denote an optionally substituted alkyl, alkenyl, aryl or cyanoalkyl group having 1 to 10 carbon atoms, and 40% or less of the total in molar ratio is vinyl, phenyl or halogenated phenyl. $R^1$ and $R^2$ each being methyl group are preferred because this leads to the lowest surface energy, and the methyl group content is preferably at least 60% in molar ratio. The molecular chain has at least one reactive group such as hydroxyl group at its chain end or in its side chain.

Alternatively, a stable organosilicon compound in which crosslinking reaction does not occur, such as dimethylpolysiloxane, may be mixed into a binder along with the above-described organopolysiloxane.

The decomposition material is described next.

In the second and third embodiments above, the photocatalyst-containing layer needs to contain a decomposition material that is decomposed by action of a photocatalyst upon energy irradiation, whereby the wettability on the photocatalyst-containing layer is caused to vary. Specifically, when a binder does not have the function of causing the wettability on the photocatalyst-containing layer to vary, or when this function is insufficient, a decomposition material as described above is added to thereby cause the wettability on the photocatalyst-containing layer to vary or thereby assist in causing the change.

As such a decomposition material, use may be made of a surfactant that is decomposed by action of a photocatalyst and has the function of causing the wettability at the surface of the photocatalyst-containing layer to vary by means of the decomposition. Specific examples thereof include hydrocarbon non-ionic surfactants such as respective series of NIKKOL BL, BC, BO and BB available from Nikko Chemicals Co., Ltd.; and fluorinated or silicone non-ionic surfactants such as ZONYL FSN and FSO available from DuPont, SURFLON S-141 and 145 available from Asahi Glass Co., Ltd., MEGAFACE F-141 and 144 available from DIC Corporation, Ftergent F-200 and F251 available from NEOS Company Limited, UNIDYNE DS-401 and 402 available from Daikin Industries, Ltd. and Fluorad FC-170 and 176 available from 3M Company, as well as cationic surfactants, anionic surfactants and amphoteric surfactants.

Examples of the decomposition material further include, in addition to surfactants, oligomers and polymers such as polyvinyl alcohol, unsaturated polyester, acrylic resin, polyethylene, diallyl phthalate, ethylene-propylene-diene monomers, epoxy resin, phenolic resin, polyurethane, melamine resin, polycarbonate, polyvinyl chloride, polyamide, polyimide, styrene-butadiene rubber, chloroprene rubber, polypropylene, polybutylene, polystyrene, polyvinyl acetate, nylon, polyester, polybutadiene, polybenzimidazole, polyacrylonitrile, epichlorohydrin, polysulfide and polyisoprene.

Furthermore, it is preferable that the photocatalyst-containing layer contain fluorine and that the photocatalyst-containing layer be formed so that when the photocatalyst-containing layer is irradiated with energy, the fluorine content at the surface of the photocatalyst-containing layer is decreased by action of the photocatalyst described above compared to before energy irradiation.

As to the fluorine content in the photocatalyst-containing layer containing fluorine as described above, the fluorine content at a lyophilic area which has been formed upon energy irradiation and contains a small amount of fluorine is preferably up to 10, more preferably up to 5 and most preferably up to 1 as compared to the fluorine content at an area unexposed to energy irradiation which is defined as 100.

A self-assembled monolayer composed of an organic molecular film or the like may be used for the first film 50. Organic molecules thereof for processing a surface of a substrate each have at its one end a functional group bondable to the substrate and at its other end a functional group capable of modifying the surface property of the substrate to be, for instance, liquid-repellent (i.e., controlling the surface energy), as well as a linear or partially-branched carbon chain connecting these functional groups. The organic molecules are bonded to the substrate and self-assembled to form a molecular film, for instance, a monomolecular film.

The self-assembled monolayer is a film which is composed of a bonding functional group capable of reacting with any of atoms constituting an underlayer such as a substrate, as well as linear chain molecules other than the bonding functional group, and which is formed by orienting compounds having extremely-high orientation properties by interaction of the linear chain molecules. The self-assembled monolayer is formed by monomolecular orientation, which enables the resultant film to be extremely thin and to be uniform at the molecular level. Specifically, since the same molecules are present at the film surface, uniform and excellent liquid repellency can be imparted to the film surface.

When, for instance, a fluoroalkylsilane is used as the above-described compound having high orientation properties, compounds are oriented so that fluoroalkyl groups are positioned at the film surface, thereby forming the self-assembled monolayer. Thus, uniform liquid repellency can be imparted to the film surface.

Exemplary compounds used to form the self-assembled monolayer include fluoroalkylsilanes (hereinafter abbreviated as "FAS") such as heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydrooctyltriethoxysilane, tridecafluoro-1,1,2,2-tetrahydrooctyltrimethoxysilane, tridecafluoro-1,1,2,2-tetrahydrooctyltrichlorosilane, and trifluoropropyltrimethoxysilane. These are preferably used alone, while use of a combination of two or more thereof is also possible as long as the intended objects of the invention are not impaired. In the present invention, the FAS is preferred for use as the above-described compound forming the self-assembled monolayer in terms of imparting adhesion to a substrate and excellent liquid repellency.

The FAS is generally expressed by the structural formula: $R_nSiX_{(4-n)}$, where n represents an integer of at least 1 but up to 3, and X denotes a hydrolyzable group such as a methoxy group, an ethoxy group and a halogen atom. R herein denotes a fluoroalxyl group and has the structure of $(CF_3)(CF_2)x(CH_2)y$ (where x represents an integer of at least 0 but up to 10, and y represents an integer of at least 0 but up to 4). When a plural number of R's or X's are bonded to Si, the plural number of R's or X's may be all the same or different from each other. A hydrolyzable group denoted by X forms a silanol by hydrolysis, reacts with a hydroxyl group of the underlayer which is a substrate, and is bonded to the substrate via a siloxane bond. On the other hand, since R has on its surface a fluoro group such as ($CF_3$), R modifies the surface of the underlayer such as a substrate into an unwettable surface (having low surface energy).

The material compound described above and a substrate are placed in a closed vessel together and, in the case of room temperature, allowed to stand for about two to three days, whereby the self-assembled monolayer composed of an organic molecular film or the like is formed. When the whole closed vessel is kept at a temperature of 100° C., the self-assembled monolayer is formed on the substrate in about three hours. While the above-described method is for formation from a gas phase, the self-assembled monolayer can be formed also from a liquid phase. For example, a substrate is immersed in a solution containing the material compound, rinsed and dried, whereby the self-assembled monolayer can be formed.

It is preferable to perform a pretreatment, such as irradiation of a substrate surface with ultraviolet light and rinsing a substrate with a solvent, before formation of the self-assembled monolayer.

The first film 50 may be formed of a material whose critical surface tension greatly varies upon application of energy. Examples of such a material include a polymeric material having a hydrophobic group in its side chain, and such a polymeric material is exemplified by one in which the main chain having a skeleton of, for instance, polyimide or (meth) acrylate is, directly or via a bonding group, bonded to a side chain having a hydrophobic group.

Examples of the hydrophobic group include groups respectively having end structures of —$CF_2CH_3$, —$CF_2CF_3$, —$CF(CF_3)_2$, —$C(CF_3)_3$, —$CF_2H$ and —$CFH_2$. In order to easily orient molecular chains, the group preferably has a long carbon chain, and more preferably has 4 or more carbon atoms. Furthermore, a polyfluoroalkyl group (hereinafter abbreviated as "Rf group") in which two or more hydrogen atoms of an alkyl group is substituted with fluorine atoms is preferred, a Rf group having 4 to 20 carbon atoms is more preferred, and a RF group having 6 to 12 carbon atoms is particularly preferred. Of a Rf group having a straight chain structure and that having a branched chain structure, a Rf group having a straight chain structure is preferred. The hydrophobic group is preferably a perfluoroalkyl group in which hydrogen atoms of an alkyl group are substantially all substituted with fluorine atoms. The perfluoroalkyl group is preferably a group expressed by $C_nF_{2n+1}$— (where n is an integer of 4 to 16), and particularly preferably a group expressed by the same formula, where n is an integer of 6 to 12. While either of a perfluoroalkyl group having a straight chain structure or that having a branched chain structure may be used, a perfluoroalkyl group having a straight chain structure is preferred.

Details of the above-described material is described, for instance, in JP 2796575 B and thus well known. The material exhibits lyophilic properties when brought into contact with a liquid or a solid under heating, and exhibits a lyophobic properties when heated in air. In other words, the critical surface tension of the material varies due to (a selected medium to be brought into contact and) thermal energy to be applied.

Examples of the hydrophobic group also include groups respectively having end structures with no fluorine atom of —$CH_2CH_3$, —$CH(CH_3)_2$ and —$C(CH_3)_3$. Also in this case, in order to easily orient molecular chains, the group preferably has a long carbon chain, and more preferably has 4 or more carbon atoms. While either of a hydrophobic group having a straight chain structure or that having a branched chain structure may be used, a hydrophobic group having a straight chain structure is preferred. The above-mentioned alkyl group may contain a halogen atom, a cyano group, a phenyl group, a hydroxyl group, a carboxyl group, or a phenyl group substituted with a linear, branched or cyclic alkyl or alkoxy group having 1 to 12 carbon atoms. The surface energy (critical surface tension) is decreased with increasing binding sites of R, and probably because of that, the material becomes lyophobic. It is assumed that the critical surface tension is increased since a part of bonding is broken or the orientation state varies upon ultraviolet irradiation or the like, and the material becomes lyophilic.

In addition, the hydrophobic group may be an organosilicon group that can be expressed by —$SiR_3$. R used herein is an organic group having a siloxane bond.

Among the hydrophobic groups described above, particularly in a hydrophobic group having a methylene group, the bond energy of C—H (338 kJ/mol) is smaller than the bond energy of a C—F bond (552 kJ/mol) of a fluorine-based material or the bond energy of a Si—C bond (451 kJ/mol) of a silicone material. Therefore, a part of bonding can be easily broken by application of energy, e.g., by ultraviolet irradiation.

The polymeric material having a hydrophobic group in its side chain is exemplified by a polymeric material containing a polyimide. Since a polyimide is excellent in electrical insulating properties, chemical resistance and heat resistance, swelling or cracking is not caused by a solvent or the change in temperature due to baking during formation of an electrode layer or the like on an insulating, wettability changeable layer. Accordingly, in a laminated structure, it is possible to form an insulating, wettability changeable layer that is excellent in electrical insulating properties, is not damaged during the manufacture process, and is highly reliable. In the case where an insulating, wettability changeable layer is composed of two or more materials, in view of heat resistance, solvent resistance and affinity, other materials than the polymeric material having a hydrophobic group in its side chain are preferably also polyimides.

Polyimide materials generally have a relative permittivity lower than that of $SiO_2$ which is commonly used as an insulating material, and are thus advantageous for an interlayer insulating film. A hydrophobic group of a polyimide having a hydrophobic group in its side chain is, for instance, one of those expressed by the following chemical formulas.

[Chemical Formula 2]

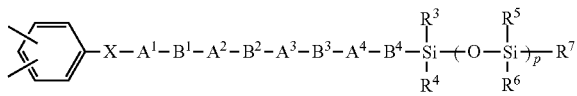

Herein, X is —$CH_2$— or —$CH_2CH_2$—; $A^1$ is 1,4-cyclohexylene, 1,4-phenylene, or 1,4-phenylene substituted with 1 to 4 fluorines; $A^2$, $A^3$ and $A^4$ are each independently a single bond, 1,4-cyclohexylene, 1,4-phenylene, or 1,4-phenylene substituted with 1 to 4 fluorines; $B^1$, $B^2$ and $B^3$ are each independently a single bond or —$CH_2CH_2$—; $B^4$ is an alkylene having 1 to 10 carbon atoms, $R^3$, $R^4$, $R^5$, $R^6$ and $R^7$ are each independently an alkyl having 1 to 10 carbon atoms; and p is an integer of at least 1.

[Chemical Formula 3]

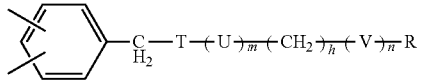

In the chemical formula above, T, U and V are each independently a benzene ring or a cyclohexane ring, in which arbitrary H on those rings may be substituted with an alkyl having 1 to 3 carbon atoms, a fluoro-substituted alkyl having 1 to 3 carbon atoms, F, Cl or CN; m and n are each independently an integer of 0 to 2; h is an integer of 0 to 5; and R is H, F, Cl, CN or a monovalent organic group, wherein when the number of U is two with m being 2 or when the number of V is two with n being 2, the U's or the V's may be the same as or different from each other.

[Chemical Formula 4]

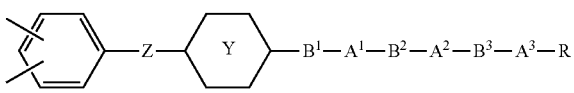

In the chemical formula above, a linking group Z is $CH_2$, $CFH$, $CF_2$, $CH_2CH_2$ or $CF_2O$; a ring Y is 1,4-cyclohexylene, or 1,4-phenylene in which 1 to 4 H's may be substituted with F or $CH_3$; $A'$ to $A^3$ are each independently a single bond, 1,4-cyclohexylene, or 1,4-phenylene in which 1 to 4 H's may be substituted with F or $CH_3$; $B^1$ to $B^3$ are each independently a single bond, an alkylene having 1 to 4 carbon atoms, an oxygen atom, an oxyalkylene having 1 to 3 carbon atoms, or an alkyleneoxy having 1 to 3 carbon atoms; and R is H, an alkyl having 1 to 10 carbon atoms in which arbitrary $CH_2$ may be substituted with $CF_2$, or an alkoxy or alkoxyalkyl having 1 to 9 carbon atoms in which one $CH_2$ may be substituted with $CF_2$, wherein a bonding position of an amino group on a benzene ring is not limited. However, when Z is $CH_2$, it is impossible that all of $B^1$ to $B^3$ are each an alkylene having 1 to 4 carbon atoms at the same time; when Z is $CH_2CH_2$ and the ring Y is 1,4-phenylene, it is impossible that both of $A'$ and $A^2$ are single bonds; and when Z is $CF_2O$, it is impossible that the ring Y is 1,4-cyclohexylene.

[Chemical Formula 5]

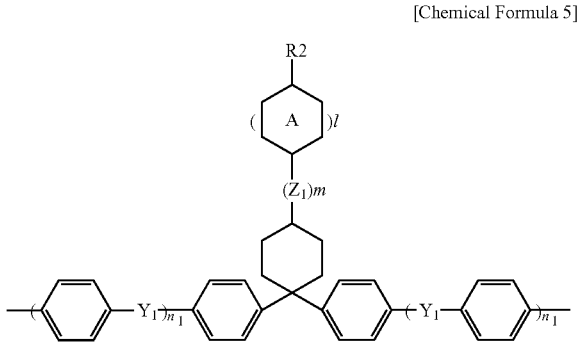

In the chemical formula above, R2 is a hydrogen atom or an alkyl group having 1 to 12 carbon atoms; $Z_1$ is a $CH_2$ group; m is 0 to 2; a ring A is a benzene ring or a cyclohexane ring; l is 0 or 1; each $Y_1$ is independently an oxygen atom or a $CH_2$ group; and each $n_1$ is independently 0 or 1.

[Chemical Formula 6]

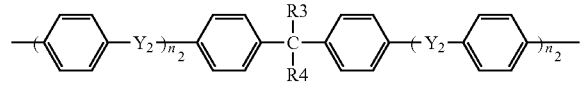

In the chemical formula above, each $Y_2$ is independently an oxygen atom or a $CH_2$ group; R3 and R4 are each independently a hydrogen atom, an alkyl group having 1 to 12 carbon atoms or a perfluoroalkyl group, wherein at least one of R3 and R4 is an alkyl group having 3 or more carbon atoms or a perfluoroalkyl group; and each $n_2$ is independently 0 or 1.

The foregoing materials are described in detail in JP 2002-162630 A, JP 2003-96034 A, JP 2003-267982 A and the like. For tetracarboxylic dianhydride constituting a skeleton of main chain of each hydrophobic group described above, use may be made of various materials such as aliphatic, alicyclic and aromatic materials. To be more specific, pyromellitic dianhydride, cyclobutanetetracarboxylic dianhydride, butanetetracarboxylic dianhydride and the like may be used. In addition, materials described in detail in JP 11-193345 A, JP 11-193346 A, JP 11-193347 A and the like are also applicable.

A polyimide having a hydrophobic group of any of the foregoing chemical formulas may be used alone or mixed with another material. When mixed with another material for use, in view of heat resistance, solvent resistance and affinity, the material to be mixed is preferably also a polyimide. A polyimide having a hydrophobic group which is not expressed by the chemical formulas above may also be used.

The first film 50 may contain a photopolymerization initiator and a monomer and/or an oligomer of acrylic acid.

The first film 50 may be a blended material of a polyimide made solely of the main chain and having no side chain which controls the wettability and a polyimide made of the main chain and a side chain which controls the wettability and achieves a low surface energy before application of energy; or a blended material of a polyamic acid being a precursor of a polyimide made solely of the main chain and having no side chain which controls the wettability and a polyamic acid being a precursor of a polyimide made of the main chain and a side chain which controls the wettability and achieves a low surface energy before application of energy. When a blended material of a material made solely of the main chain and having no side chain which controls the wettability and a material made of the main chain and a side chain which controls the wettability and achieves a low surface energy before application of energy is utilized, it is possible to form fine concaves (irregularities) by application of energy such as ultraviolet light even when use is made of resins such as epoxy resin, fluororesin, acrylic resin, polyvinyl phenol and polyvinyl butyral.

In this case, exemplary insulating materials for the first film 50 include organic materials such as polyimide, polyamide-imide, epoxy resin, silsesquioxane, polyvinylphenol, polycarbonate, fluororesin, poly-para-xylylene and polyvinyl butyral. Polyvinylphenol and polyvinyl alcohol may be crosslinked with a suitable crosslinking agent. Inorganic materials that may be used include $TiO_2$ and $SiO_2$.

A self-assembled monolayer composed of an organic molecular film or the like may be used for the first film 50.

Organic molecules thereof each have at its one end a functional group bondable to a substrate and at its other end a functional group capable of modifying the surface property of the substrate to be, for instance, liquid-repellent (i.e., controlling the surface energy). The organic molecules each have a linear or partially-branched carbon chain connecting those functional groups, and are bonded to the substrate and self-assembled to form a molecular film, for instance, a monomolecular film. The self-assembled monolayer is a film which is composed of a bonding functional group capable of reacting with any of atoms constituting an underlayer such as a substrate, as well as linear chain molecules other than the bonding functional group, and which is formed by orienting compounds having high orientation properties by interaction of the linear chain molecules.

The self-assembled monolayer is formed by monomolecular orientation, which enables the resultant film to be extremely thin and to be uniform at the molecular level. Specifically, since the same molecules are present at the film surface, uniform and excellent liquid repellency can be imparted to the film surface. The self-assembled monolayer composed of an organic molecular film or the like is formed by placing a material compound such as an organosilane molecule along with a substrate in a closed vessel and, in the case of room temperature, allowing them to stand for about two to three days.

When the whole closed vessel is kept at a temperature of 100° C., the self-assembled monolayer is formed on the substrate in about three hours. While the above-described method is for formation from a gas phase, the self-assembled monolayer can be formed also from a liquid phase. For example, a substrate is immersed in a solution containing the material compound, rinsed and dried, whereby the self-assembled monolayer can be formed on the substrate. It is preferable to perform a pretreatment, such as irradiation of a substrate surface with ultraviolet light and rinsing a substrate with a solvent, before formation of the self-assembled monolayer. Owing to the process described above, the substrate surface can be formed to have uniform liquid repellency.

The present invention is basically configured as described above. While the pattern formation apparatus and the pattern formation method of the present invention have been described above in detail, the present invention is by no means limited to the above embodiments, and various improvements and modifications may of course be made without departing from the spirit of the present invention.

What is claimed is:

1. A pattern formation method, comprising:
a first step of forming a film having a flat surface on an uneven structure including a concave portion exhibiting liquid repellency and a convex portion exhibiting lyophilic properties so as to cover the concave portion and the convex portion; and
a second step of forming a pattern by drying the film, wherein the film is formed with a coating liquid that satisfies:

$$\sigma > 0.153 p^{1.947} \times \delta^{-3.84} \times |a_H|^{1.022}$$

where surface tension is denoted by $\sigma$ (N/m); film thickness is denoted by $\delta$ (m); pitch of irregularities made up of the concave portion exhibiting liquid repellency and the convex portion exhibiting lyophilic properties is denoted by p (m); and Hamaker constant is denoted by $a_H$ (J).

2. The pattern formation method according to claim 1, wherein the film is one of a film having lyophilic properties, a film having liquid repellency and a lyophilic/lyophobic variable film having a lyophilic/lyophobic variable function.

3. The pattern formation method according to claim 2, wherein on the lyophilic/lyophobic variable film, a portion irradiated with ultraviolet light is caused to be lyophilic and to reduce in thickness.

4. The pattern formation method according to claim 1, wherein the convex portion is constituted by electric wiring or an electrode for a semiconductor, and the concave portion is constituted by a support on which the electric wiring or the electrode for the semiconductor is formed or by an insulating layer on which the electric wiring or the electrode for the semiconductor is formed.

5. The pattern formation method according to claim 2, wherein the convex portion is constituted by electric wiring or an electrode for a semiconductor, and the concave portion is constituted by a support on which the electric wiring or the electrode for the semiconductor is formed or by an insulating layer on which the electric wiring or the electrode for the semiconductor is formed.

6. The pattern formation method according to claim 3, wherein the convex portion is constituted by electric wiring or an electrode for a semiconductor, and the concave portion is constituted by a support on which the electric wiring or the electrode for the semiconductor is formed or by an insulating layer on which the electric wiring or the electrode for the semiconductor is formed.

7. The pattern formation method according to claim 1, wherein the first step forms the film having the flat surface by an inkjet method by adjusting an amount of ink jetted to the concave portion exhibiting liquid repellency to be larger than an amount of ink jetted to the convex portion exhibiting lyophilic properties.

8. The pattern formation method according to claim 2, wherein the first step forms the film having the flat surface by an inkjet method by adjusting an amount of ink jetted to the concave portion exhibiting liquid repellency to be larger than an amount of ink jetted to the convex portion exhibiting lyophilic properties.

9. The pattern formation method according to claim 3, wherein the first step forms the film having the flat surface by an inkjet method by adjusting an amount of ink jetted to the concave portion exhibiting liquid repellency to be larger than an amount of ink jetted to the convex portion exhibiting lyophilic properties.

10. The pattern formation method according to claim 4, wherein the first step forms the film having the flat surface by an inkjet method by adjusting an amount of ink jetted to the concave portion exhibiting liquid repellency to be larger than an amount of ink jetted to the convex portion exhibiting lyophilic properties.

* * * * *